(12) United States Patent
da Silva et al.

(10) Patent No.: US 11,609,137 B2
(45) Date of Patent: Mar. 21, 2023

(54) ESTIMATING MOTOR DRIVE TORQUE AND VELOCITY

(71) Applicant: Rockwell Automation Technologies, Inc., Mayfield Heights, OH (US)

(72) Inventors: Aderiano M. da Silva, Oak Creek, WI (US); Michael Cromheecke, Grafton, WI (US); Robert Miklosovic, Mayfield Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 501 days.

(21) Appl. No.: 16/834,057

(22) Filed: Mar. 30, 2020

(65) Prior Publication Data

US 2021/0302251 A1    Sep. 30, 2021

(51) Int. Cl.
*G01L 5/26* (2006.01)
*G01P 3/44* (2006.01)
*G01R 19/00* (2006.01)

(52) U.S. Cl.
CPC .......... *G01L 5/26* (2013.01); *G01P 3/44* (2013.01); *G01R 19/0046* (2013.01)

(58) Field of Classification Search
CPC ......... G01L 5/26; G01P 3/44; G01R 19/0046; H02P 21/18; H02P 21/20; H02P 23/14
USPC ............. 702/33, 41, 44, 64, 145–147, 151, 702/182–183, 188
See application file for complete search history.

(56) References Cited

U.S. PATENT DOCUMENTS

| | | | | |
|---|---|---|---|---|
| 8,710,777 | B2* | 4/2014 | Tian | G05B 13/0265 |
| | | | | 702/41 |
| 10,469,016 | B1* | 11/2019 | Fast | H02P 23/20 |
| 2011/0313717 | A1* | 12/2011 | Lu | H02P 27/047 |
| | | | | 702/147 |
| 2015/0349673 | A1* | 12/2015 | Wu | H02P 23/14 |
| | | | | 318/779 |
| 2019/0242947 | A1* | 8/2019 | Smiley | G01R 31/343 |
| 2020/0067439 | A1* | 2/2020 | Fast | H02P 23/0077 |
| 2020/0177117 | A1* | 6/2020 | Preindl | H03H 21/0043 |

FOREIGN PATENT DOCUMENTS

| | | | | |
|---|---|---|---|---|
| CN | 203675027 U | * | 6/2014 | .......... H02P 21/0021 |
| CN | 107395084 A | * | 11/2017 | .............. H02P 21/14 |
| CN | 107395084 A | | 11/2017 | |

OTHER PUBLICATIONS

B. Lu et al., "A Nonintrusive and In-Service Motor Efficiency Estimation Method using air-Gap Torque with Considerations of Condition Monitoring", IEEE Industry Applications Conference Forty-First AIS Annual Meeting, Oct. 1, 2006,. pp. 1533-1540.

(Continued)

*Primary Examiner* — Jeffrey P Aiello
(74) *Attorney, Agent, or Firm* — Kunzler Bean & Adamson

(57) ABSTRACT

For estimating motor torque and velocity, a method estimates a velocity profile for a motor based on line-to-line voltages and phase currents for the motor. The velocity profile is estimated without a position input and a velocity input. The method further estimates a torque profile for the motor based on the line-to-line voltages, the phase currents, and a time interval of the velocity profile of motor velocities greater than a velocity threshold, and wherein the motor is operating over the time interval.

18 Claims, 21 Drawing Sheets

(56) References Cited

OTHER PUBLICATIONS

EPO, Extended European Search Report, European Patent Office, dated Aug. 13, 2021, pp. 1-41.
M. Godoy Simoes et al., "Neural Network Based Estimation of Feedback Signals for a Vector Controlled Induction Motor Drive", IEEE Transactions on Industryu Applications, May/Jun. 1995, No. 3, pp. 620-629.

* cited by examiner

ESTIMATING MOTOR DRIVE TORQUE AND VELOCITY

BACKGROUND INFORMATION

The subject matter disclosed herein relates to estimating motor drive torque and velocity.

BRIEF DESCRIPTION

A method for estimating motor torque and velocity is disclosed. The method estimates a velocity profile for a motor based on line-to-line voltages and phase currents for the motor. The velocity profile is estimated without a position input and a velocity input. The method further estimates a torque profile for the motor based on the line-to-line voltages, the phase currents, and a time interval of the velocity profile of motor velocities greater than a velocity threshold, and wherein the motor is operating over the time interval.

An apparatus for estimating motor torque and velocity is also disclosed. The apparatus includes a processor and a memory storing code executable by the processor. The processor estimates a velocity profile for a motor based on line-to-line voltages and phase currents for the motor. The velocity profile is estimated without a position input and a velocity input. The processor further estimates a torque profile for the motor based on the line-to-line voltages, the phase currents, and a time interval of the velocity profile of motor velocities greater than a velocity threshold. The motor is operating over the time interval.

A computer program product for estimating motor torque and velocity is also disclosed. The computer program product comprises a non-transitory computer readable storage medium having program code embedded therein. The program code is readable/executable by a processor to estimate a velocity profile for a motor based on line-to-line voltages and phase currents for the motor. The velocity profile is estimated without a position input and a velocity input. The processor further estimates a torque profile for the motor based on the line-to-line voltages, the phase currents, and a time interval of the velocity profile of motor velocities greater than a velocity threshold. The motor is operating over the time interval.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
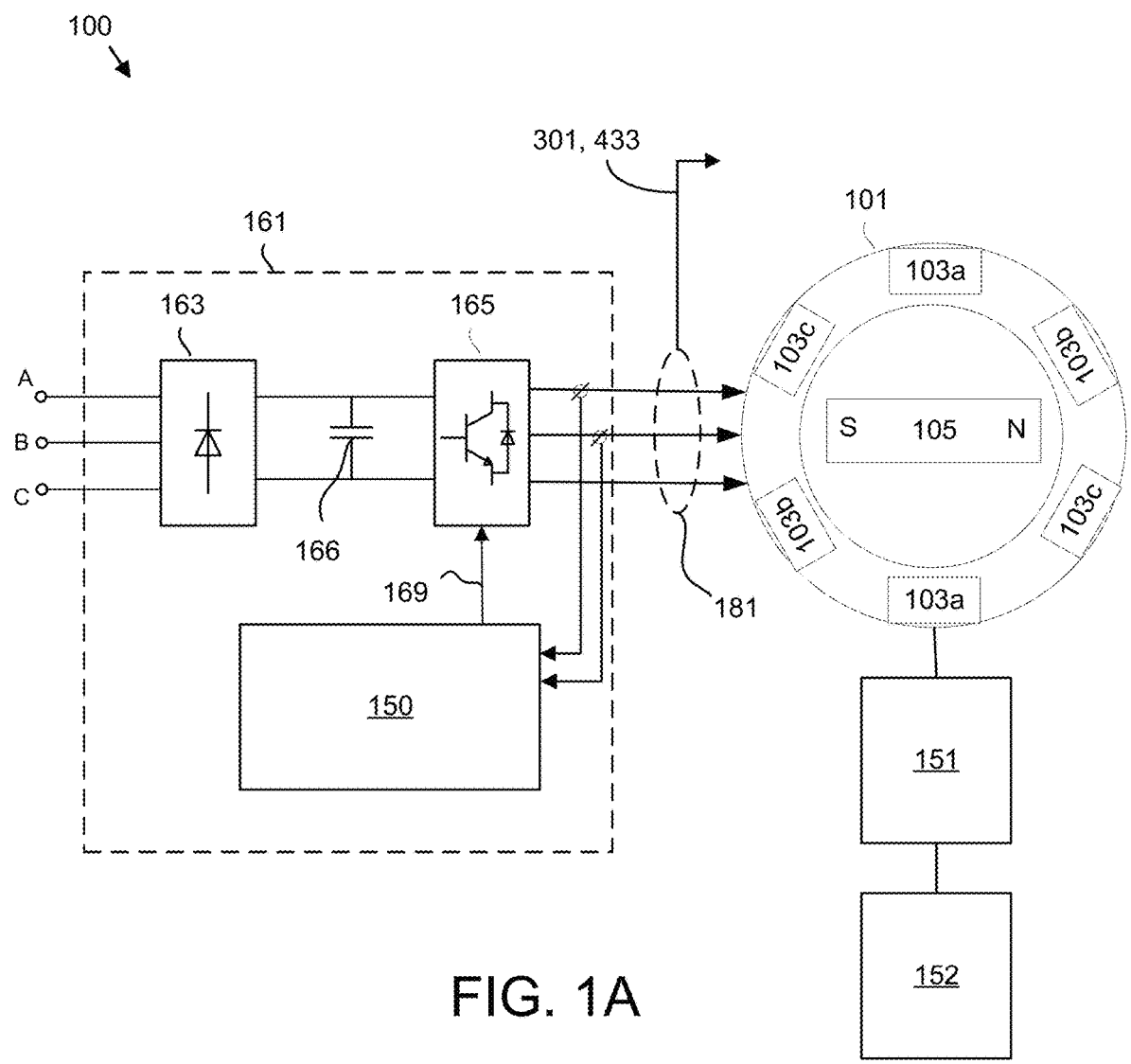
FIG. 1A is a schematic diagram of a motor system according to an embodiment.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims or may be learned by the practice of embodiments as set forth hereinafter. As will be appreciated by one skilled in a the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport U, program code for use by or in connection with an instruction execution system, apparatus, or device. Program code embodied on a computer readable signal medium may be transmitted using any appropriate medium, including but not limited to wireline, optical fiber, Radio Frequency (RF), or the like, or any suitable combination of the foregoing In one embodiment, the computer readable medium may comprise a a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Python, Ruby, R, Java, Java Script, Smalltalk, C++, C sharp, Lisp, Clojure, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). The computer program product may be shared, simultaneously serving multiple customers in a flexible, automated fashion.

The computer program product may be integrated into a client, server and network environment by providing for the computer program product to coexist with applications, operating systems and network operating systems software and then installing the computer program product on the clients and servers in the environment where the computer program product will function. In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

FIG. 1A is a schematic diagram of a motor system 100 according to an embodiment. The system 100 includes a motor 101, a motor drive 161, a gearbox 151, and a load 152. In the depicted embodiment, the motor 101 is a permanent magnet motor 101. In an alternate embodiment, the motor 101 may be an induction motor 101. The motor 101 may be connected through the gearbox 151 to the load 152. The gearbox 151 may comprise a transmission.

Figure 5A:
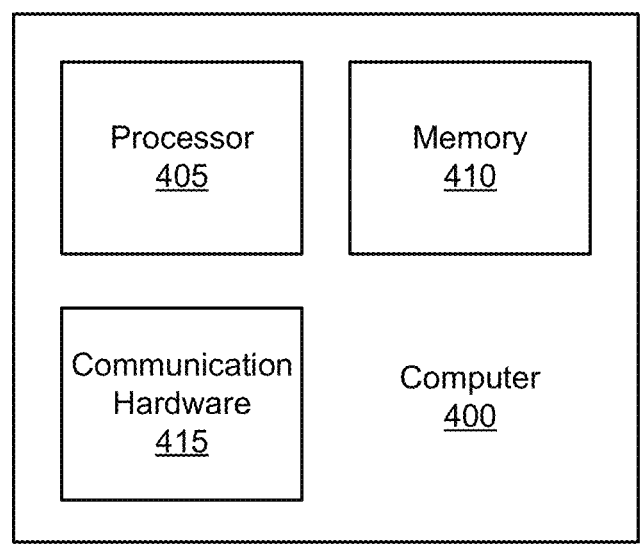
FIG. 5A is a schematic block diagram of a computer according to an embodiment.

The motor 101 may be controlled by the motor drive 161. In the depicted embodiment, the motor drive 161 includes a rectifier and/or converter 163, referred to hereafter as a rectifier 163, an inverter 165, a bus capacitor 166, and a controller 150. The controller 150 may include a processor as shown in FIG. 5A. The controller 150 may produce the gate signals 169 to control the inverter 165, and therefore control the motor 101.

In the depicted embodiment, the motor 101 includes a rotor 105 and a plurality of coils 103*a-c*. The motor drive 161 may direct electric currents through the coils 103*a-c* to generate a motor flux that drives the rotor 105.

The motor drive 161 may drive the motor 101 by producing phase currents 433 at line-to-line voltages 301 to generate torque at a specified angular velocity. In a certain embodiment, at least a portion of the motor drive 161 comprise one or more of hardware and executable code, the executable code stored on one or more computer readable storage media.

It is often desirable to estimate the torque and velocity of the motor 101. For example, if a motor 101 is to be replaced with a new target motor 101 or the load U, requirements change, it is desirable to know the torque and velocity required of the target motor 101 and supporting drive. In the past, accurately estimating the velocity and the torque at low speeds and/or a zero speed required a velocity sensor and a torque transducer for each axis of the motor 101. If voltage sensors and torque transducers were not available, they must be installed, requiring much time and expense.

The embodiments accurately estimate the velocity and torque of the motor 101 based on the line-to-line voltages 301 and the phase currents 433 for the motor 101. In the past, estimations of velocity and torque based on the line-to-line voltages 301 and the phase currents 433 resulted in significant inaccuracies due to changes in motor direction, motor operation near zero speed or at zero speed, and filtering inaccuracies. As a result, such estimations of velocity and torque could not be relied on to characterize a motor 101. The embodiments process the line-to-line voltages 301 and the phase currents 433 to accurately estimate the velocity and torque of the motor as will be described hereafter.

The line-to-line voltages 301 and the phase currents 433 may be measured with a portable sensor 181 and used to estimate the velocity and torque. As a result, the velocity and torque may be quickly and efficiently estimated anywhere, including in the field.

Figure 1B:
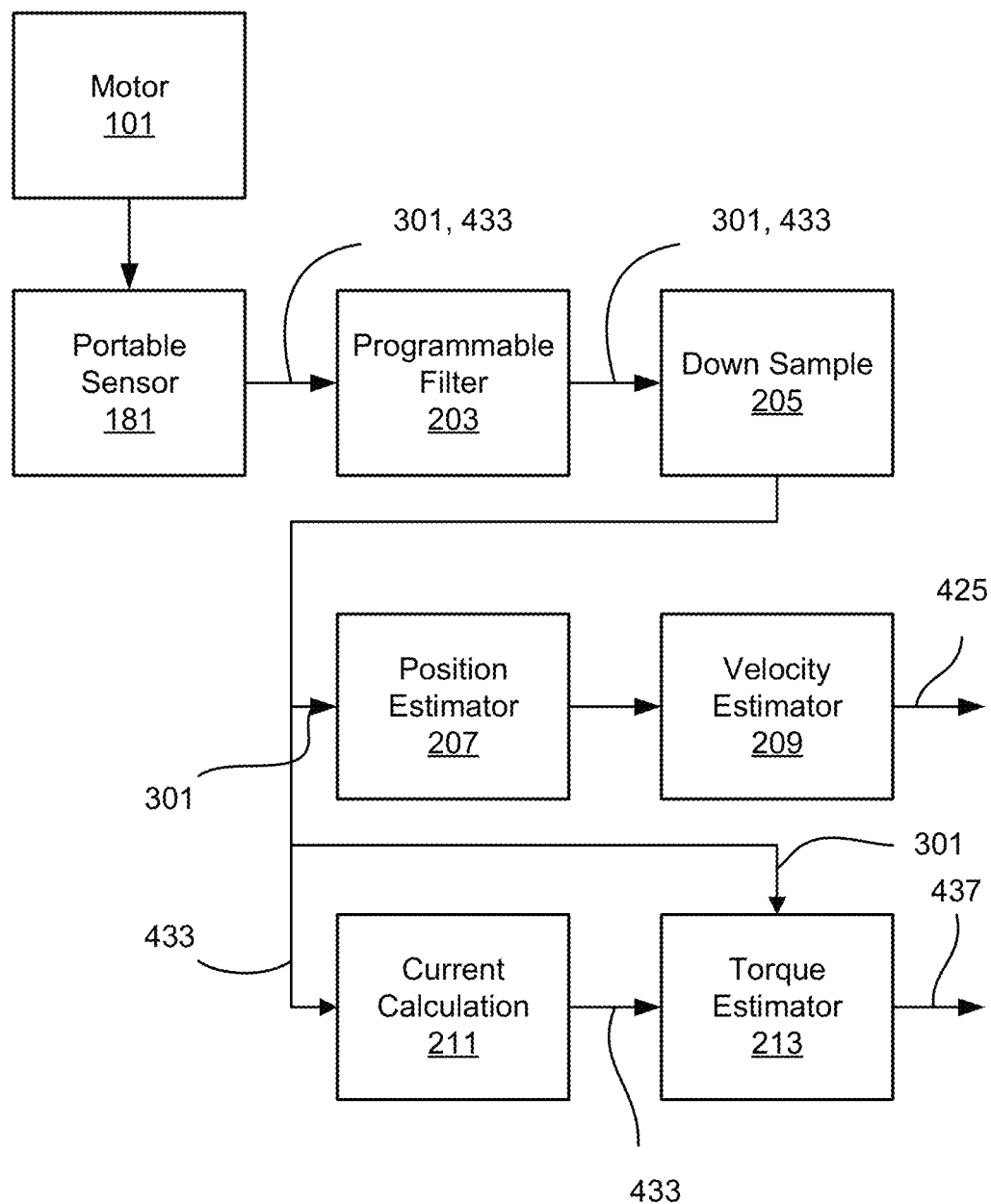
FIG. 1B is a schematic block diagram of velocity and torque estimation according to an embodiment.

FIG. 1B is a schematic block diagram of velocity and torque estimation. In the depicted embodiment, the portable sensor 181 is connected to the motor 101 and measures the line-to-line voltages 301 and the phase currents 433 provided to the motor 101. The line-to-line voltages 301 and the phase currents 433 may be filtered with a programmable filter 203 to improve the accuracy of the velocity and torque estimation. The programmable filter 203 is described in more detail in FIGS. 2A-F and 6D.

In one embodiment, the line-to-line voltages 301 and the phase currents 433 and/or the filtered line-to-line voltages 301 and phase currents 433 are down sampled 205. The down sampling 205 may be in the range of 1 to 3 orders of magnitude. For example, a 1 mega Hertz (MHz) phase current 433 may be down sampled 205 to 10 kilo Hertz (kHz), a down sampling 205 of two orders of magnitude.

A position estimator 207 may estimate an angular position of the rotor 105 based on the line-to-line voltages 301. In addition, a velocity estimator 209 may estimate the angular velocity of the rotor 105 based on the angular position to yield a velocity profile 425 as will be described hereafter.

In one embodiment, two of three phase currents 433 may be measured by the portable sensor 181. A current calculation 211 may determine a third phase current 433. In one embodiment, the third phase current 433 is a negative summation of the other two phase currents 433.

A torque estimator 213 estimates the torque profile 437 of the motor 101 based on the three phase currents 433 and the line-to-line voltages 301. As a result, both the velocity profile 425 and the torque profile 437 are accurately estimated from the line-to-line voltages 301 and the phase currents 433 without a measured position input, a measured velocity input, and/or a measured torque input. Thus, a new target motor 101 may be accurately selected quickly and efficiently.

Figure 1C:
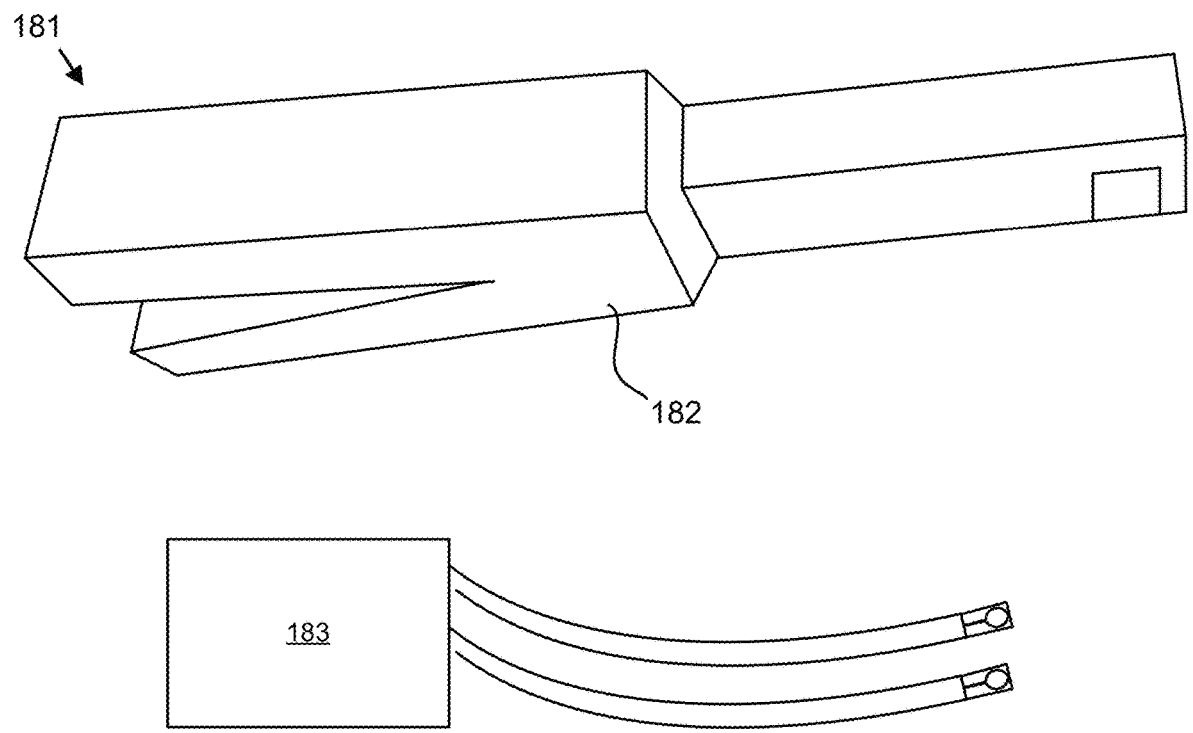
FIG. 1C is a perspective drawing of a portable sensor according to an embodiment.

FIG. 1C is a perspective drawing of the portable sensor 181. The portable sensor may include two or more voltage sensors 183 and/or two or more current sensors 182. Each current sensor 182 may be a clamp that is clamped onto a cable carrying phase currents 433 to the motor 101. Each voltage sensor 183 may be connected to two or more cables carrying the phase currents 433 to measure the line-to-line voltages 301. As a result, measurements of the line-to-line voltages 301 and the phase currents 433 may be made easily, including in the field.

Figure 2A:
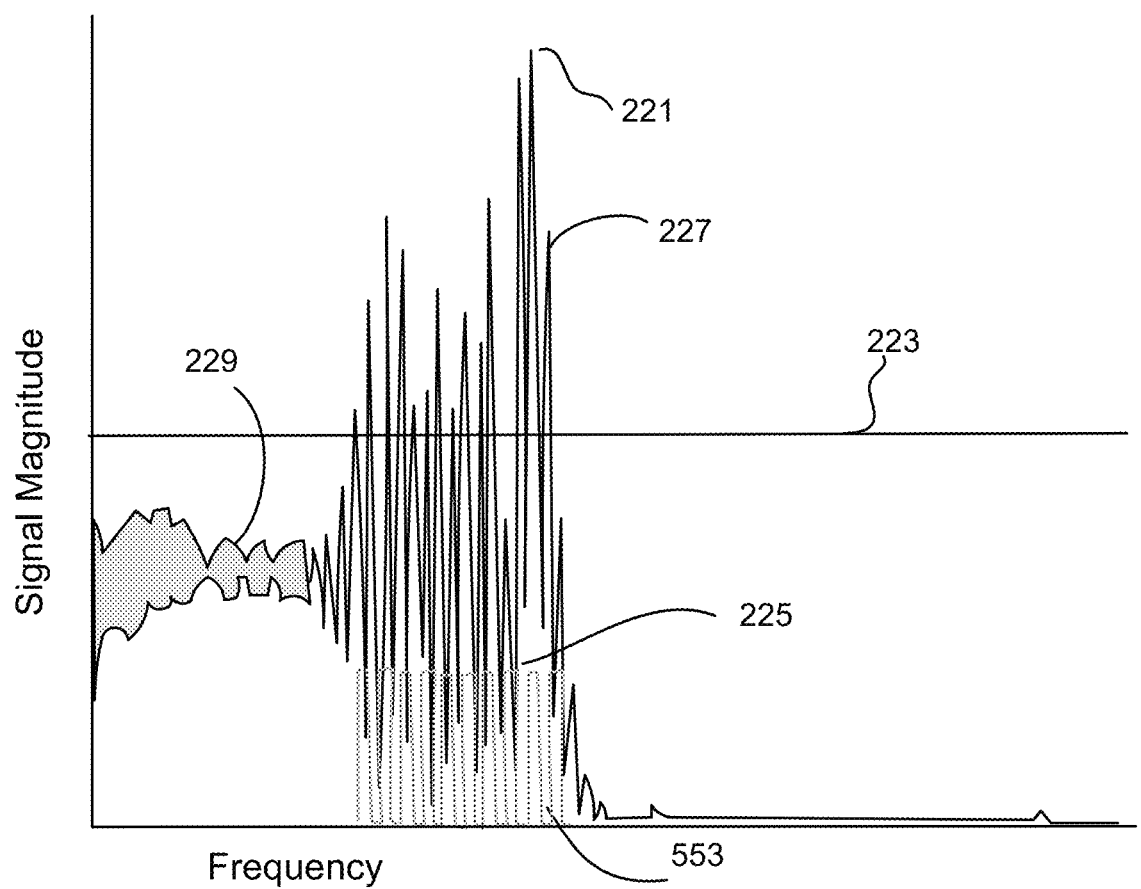
FIG. 2A is a graph illustrating determining a low-pass-filter cutoff frequency.

FIG. 2A is a graph illustrating determining a low-pass-filter cutoff frequency for the programmable filter 203. In the depicted embodiment, the graph shows the signal magnitude of a frequency-domain input signal 229 for a plurality of frequencies. In one embodiment, a time-domain signal is transformed to the frequency-domain signal 229 using a fast Fourier transform and/or discrete Fourier transform. A peak magnitude 221 of the transformed signal 229 is determined. In addition, a magnitude midpoint 223 of the peak magnitude 221 is determined. In one embodiment, the magnitude midpoint 223 is in the range of 40 to 60 percent of the peak magnitude 221. In a certain embodiment, the magnitude midpoint 223 is 50 percent of the peak magnitude 221.

A low-pass-filter cutoff frequency 533 for the programmable filter 203 may be determined from a highest frequency 227 of the transformed signal 229 that exceeds the magnitude midpoint 223. The low-pass-filter cutoff frequency 533 may be in the range of 5 to 15 percent of the highest midpoint frequency 227. In a certain embodiment, the low-pass-filter cutoff frequency 533 is 10 percent of the highest midpoint frequency 227. A unique low-pass-filter cutoff frequency 533 may be determined for each input signal. In addition, the determination of the low-pass-filter cutoff frequency 533 is computationally efficient, improving the efficacy and efficiency of a computer.

Figure 2B:
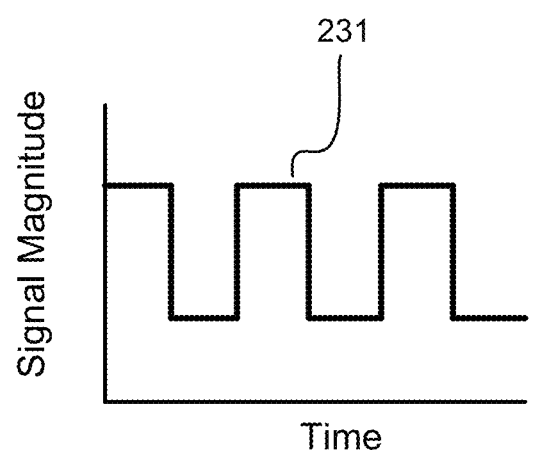
FIG. 2B is a graph illustrating an input time-domain signal according to an embodiment.

FIG. 2B is a graph illustrating a time-domain input signal 231. The input time-domain signal 231 may be received by the programmable filter 203.

Figure 2C:
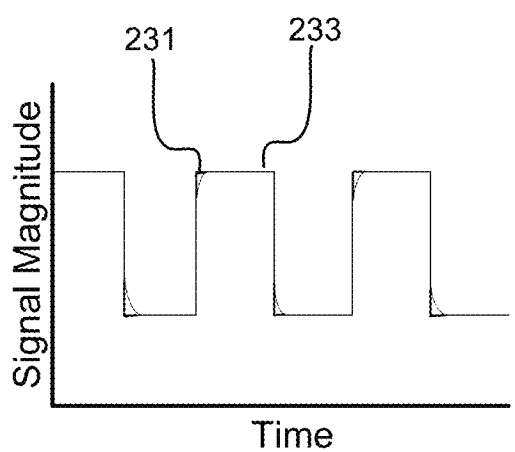
FIG. 2C is a graph illustrating an input time-domain signal and a first filtered signal according to an embodiment.

FIG. 2C is a graph illustrating the time-domain input signal 231 and a first filtered signal 233 after the programmable filter 203 is applied to the input signal 231. As shown, the programmable filter 203 removes higher frequencies of the input signal 231 to yield the first filtered signal 233.

Figure 2D:
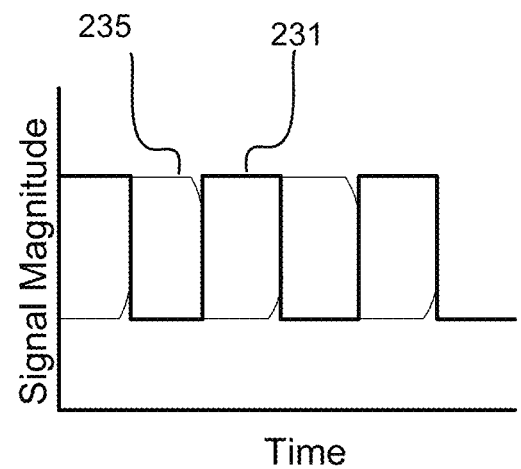
FIG. 2D is a graph illustrating a reversed first filtered signal and an input time-domain signal according to an embodiment.

FIG. 2D is a graph illustrating a reversed first filtered signal 235 and time-domain input signal 231. The first filtered signal 233 is reversed to yield the reversed first filtered signal 235. As used herein, reversing refers to reversing a time sequence of a signal. All or a portion of the signal may be reversed. As a result, a previous analog portion and/or digital representation of the signal follows subsequent analog portions and/or digital representations of the signal. The reversed first filtered signal 235 is further filtered with the programmable filter 203 to yield the second filtered signal 237.

Figure 2E:
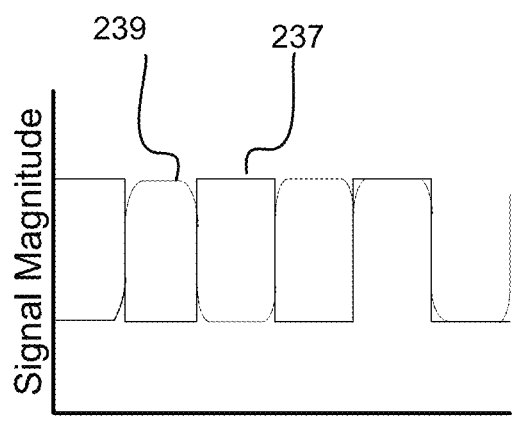
FIG. 2E is a graph illustrating a reversed second filtered signal and an input time-domain signal according to an embodiment.

FIG. 2E is a graph illustrating a reversed second filtered signal 239 and time-domain input signal 231. In the depicted embodiment, the second filtered signal 237 is reversed as the reversed second filtered signal 239 and/or output signal 239.

Figure 2F:
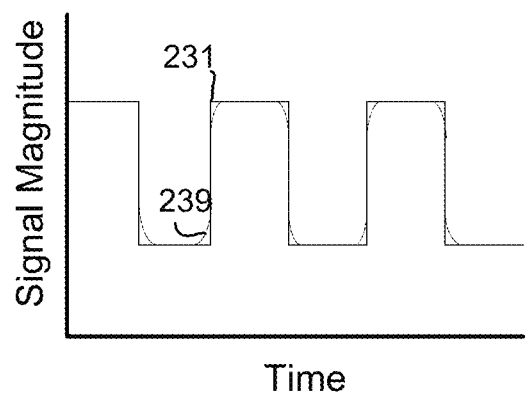
FIG. 2F is a graph illustrating an input time-domain signal and an output signal according to an embodiment.

FIG. 2F is a graph illustrating the input signal 231 and the output signal 239. As shown, the programmable filter 203 filters the time-domain input signal 231 without adding phase lag to the output signal 239. As a result, the output signal 239 may be used to accurately estimate the velocity and the torque since the output signal 239 does not add any phase lag to current and voltage signals after filtering.

Figure 3A:
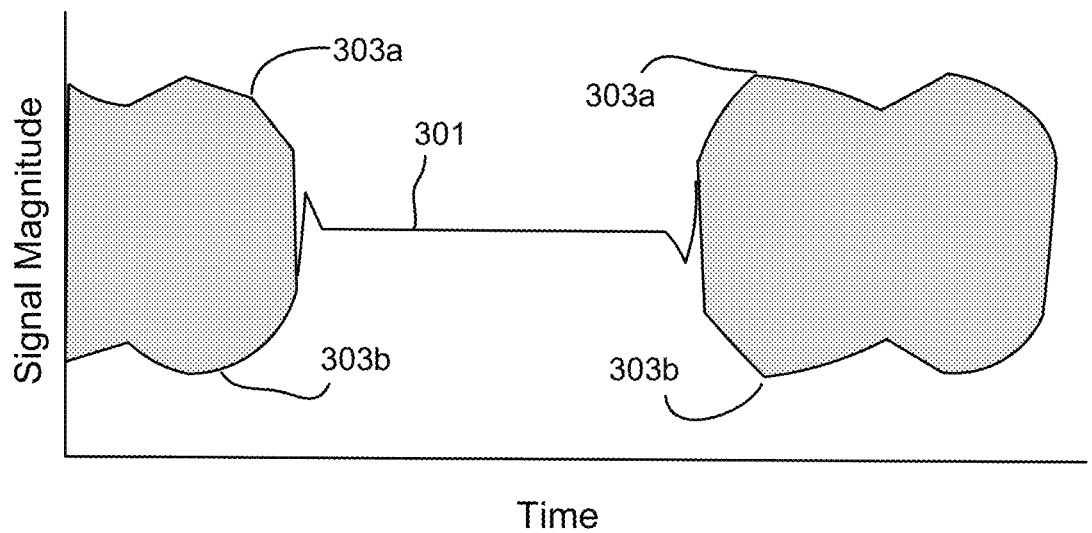
FIG. 3A is a graph illustrating a voltage envelope for a voltage signal according to an embodiment.

FIG. 3A is a graph illustrating a voltage envelope 303a-b for a line-to-line voltage signal 301. In one embodiment, the line-to-line voltage signal 301 was filtered using the programmable filter 203. The voltage envelope 303a-b is determined as peaks of the line-to-line voltage 301 including both positive and negative peaks.

Figure 3B:
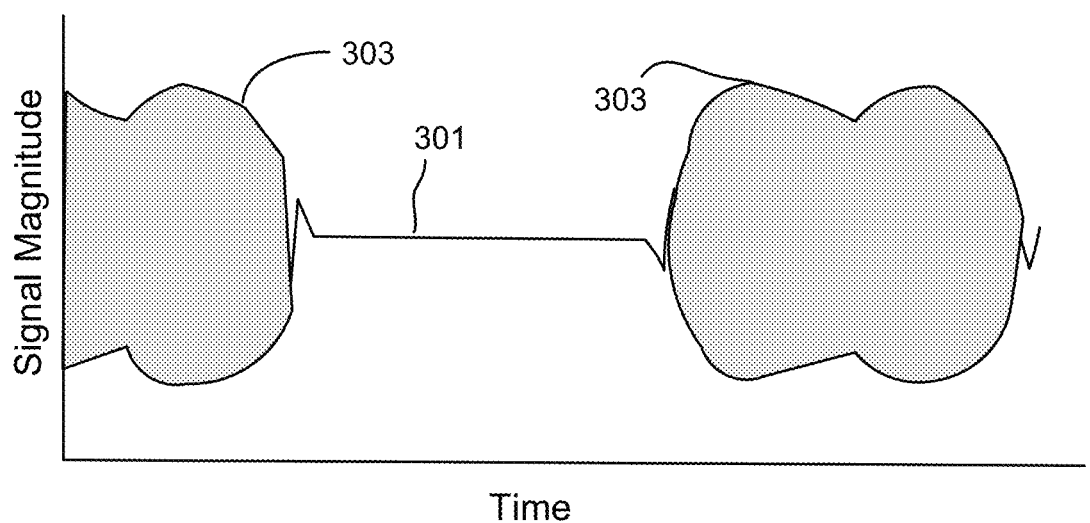
FIG. 3B is a graph illustrating a voltage envelope with merged peaks according to an embodiment.

FIG. 3B is a graph illustrating the voltage envelope 303 with merged peaks. In the depicted embodiment, values of negative peaks are reflected around a zero voltage to generate the voltage envelope 303. The positive peaks and negative peaks of the voltage envelope 303 may be merged for increased accuracy.

Figure 3C:
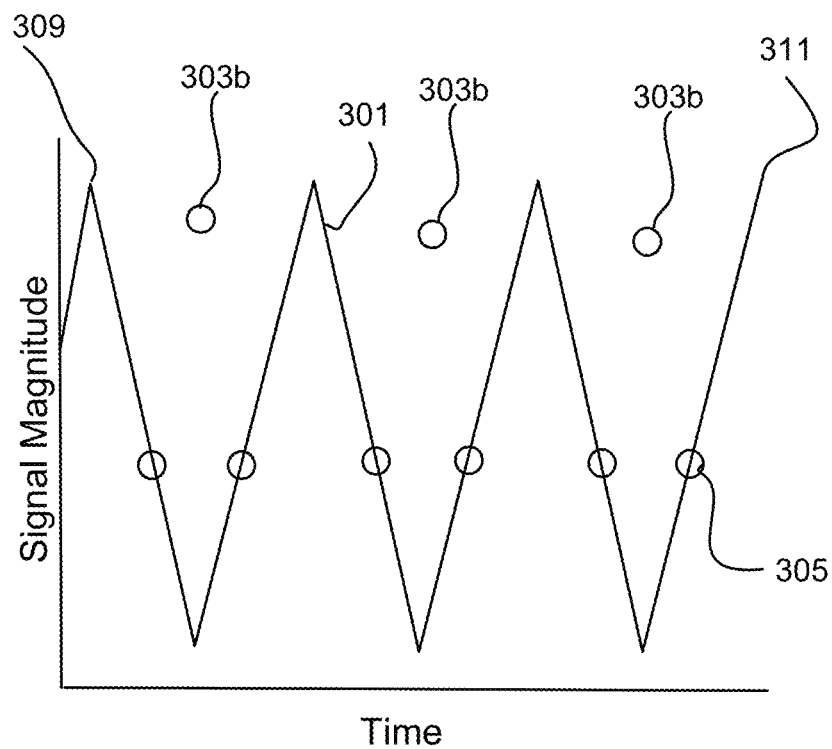
FIG. 3C is a graph illustrating zero crossings according to an embodiment.

FIG. 3C is a graph illustrating zero crossings 305 of the line-to-line voltage signal 301. In the depicted embodiment, zero voltage crossings 305 are identified for the line-to-line voltage signal 301. In addition, a voltage maximum 309 is determined for the line-to-line voltage signal 301 as having the greatest voltage.

Figure 3D:
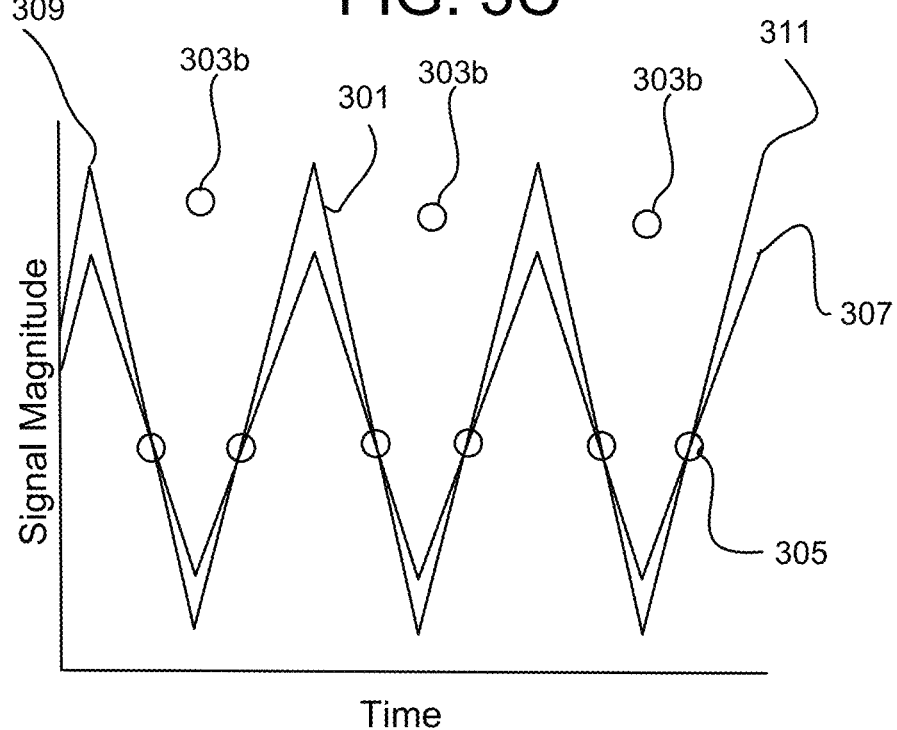
FIG. 3D is a graph of a scaled voltage envelope according to an embodiment.

FIG. 3D is a graph of a scaled voltage envelope 303. In the depicted embodiment, each voltage peak 311 of the line-to-line voltage signal 301 is scaled to the voltage maximum 309. In one embodiment, each voltage peak 311 is set equal to the voltage maximum 309.

Figure 3E:
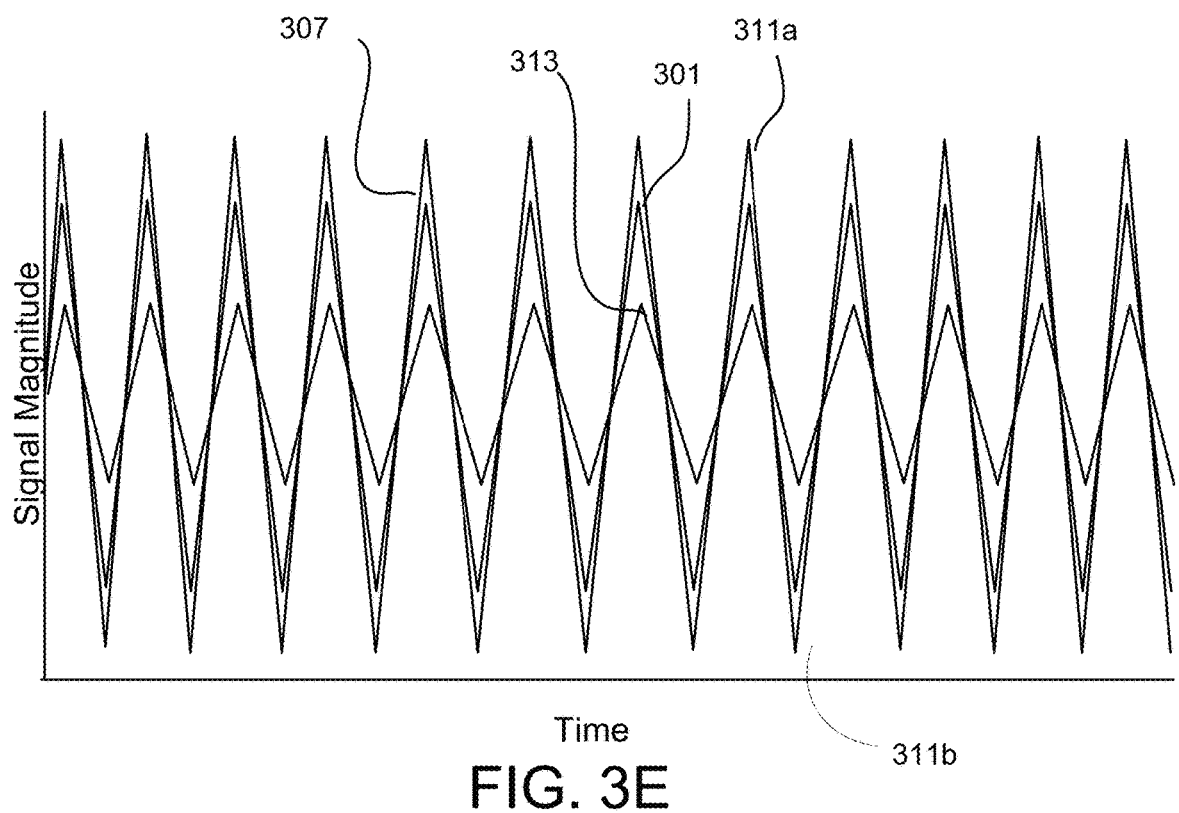
FIG. 3E is a graph illustrating a scaled voltage signal according to an embodiment.

FIG. 3E is a graph illustrating a scaled voltage signal 307 with each voltage peak 311 scaled to the voltage maximum 309. The voltage envelope 303 may also be scaled to the voltage maximum 309. An angular position Θ 313 of the rotor 105 is determined from the scaled voltage signal 307 and/or voltage peaks 311. In one embodiment, a positive voltage peak 311a is at an angular position 313 of π/2 and a negative voltage peak 311b is at an angular position 313 of −π/2.

Figure 3F:
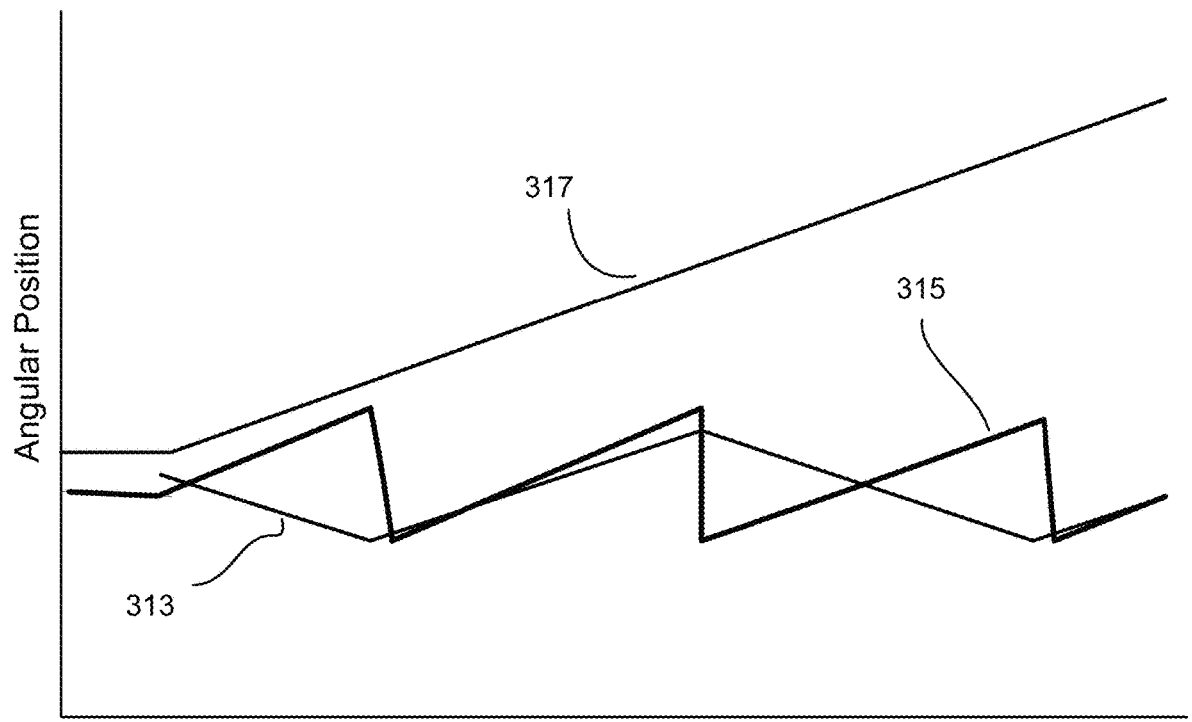
FIG. 3F is a graph illustrating single direction angular positions and a cumulative angular position according to an embodiment.

FIG. 3F is a graph illustrating single direction angular positions 315 and a cumulative angular position 317. In the depicted embodiment, the angular positions 313 of FIG. 3E with negative slope are horizontally reflected to yield single direction angular positions 315. In addition, the single direction angular positions 315 are accumulated to yield the cumulative angular position 317. In one embodiment, a first angular position of the single direction angular positions 315 is set equal to a last angular position of a proceeding single direction angular position 315 to yield the cumulative angular position 317. In addition, the first angular position of the single direction angular positions 315 may be set equal to a last angular position of a proceeding single direction angular position 315 plus a calculated offset to yield the cumulative angular position 317.

Figure 3G:
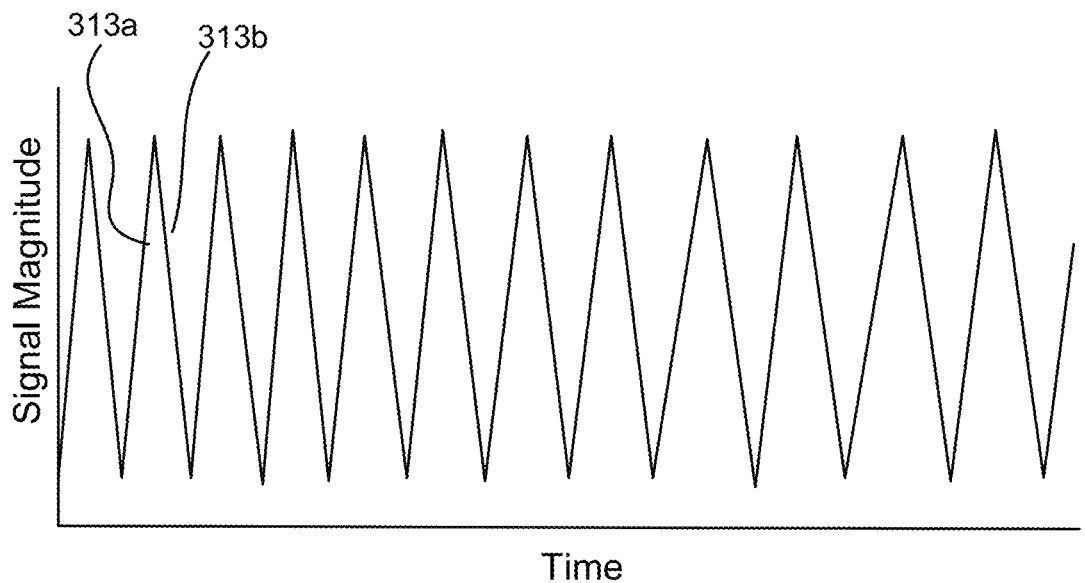
FIG. 3G is a graph illustrating angular position according to an embodiment.
Figure 3H:
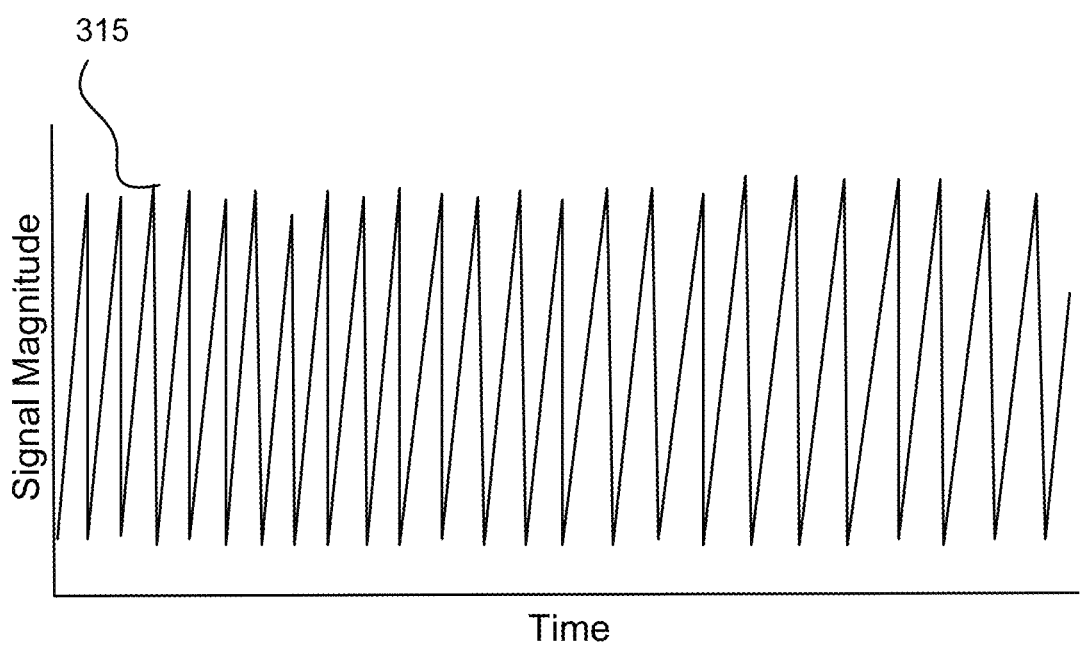
FIG. 3H is a graph illustrating single direction angular position according to an embodiment.

FIG. 3G is a graph illustrating angular position 313 of FIGS. 3E-F. positive slope angular positions 313a and negative slope angular positions 313b are shown. FIG. 3H is a graph illustrating single direction angular position 315 of FIG. 3F. In the depicted embodiment, the negative slope angular positions 313b are horizontally reflected to yield the single direction angular position 315.

Figure 3I:
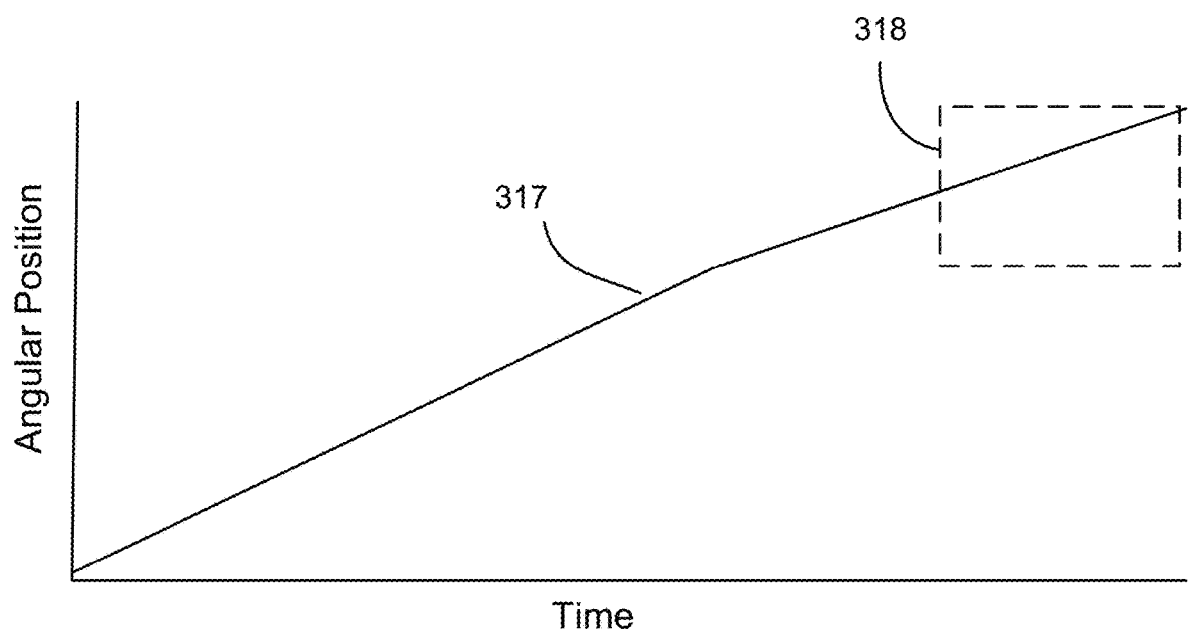
FIG. 3I is a graph illustrating cumulative angular position according to an embodiment.
Figure 3J:
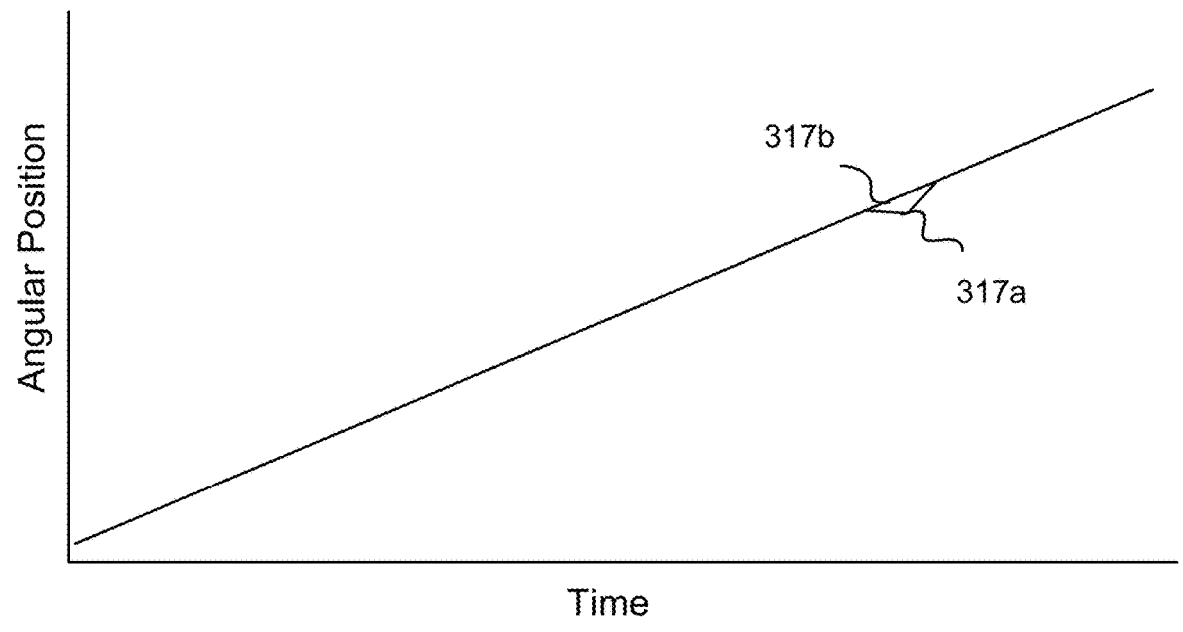
FIG. 3J is a graph illustrating detailed cumulative angular position according to an embodiment.

FIG. 3I is a graph illustrating the cumulative angular position 317 of FIG. 3F. The graph includes a detailed area 318 of the cumulative angular position 317. FIG. 3J is a graph illustrating the detailed area 318 of the cumulative angular position 317. The original cumulative angular position 317a and a filtered cumulative angular position 317b are shown. In one embodiment, the original cumulative angular position 317a is filtered with the programmable filter 203 to yield the filtered cumulative angular position 317b. Filtering the cumulative angular position 317 improves the accuracy of the cumulative angular position 317.

Figure 3K:
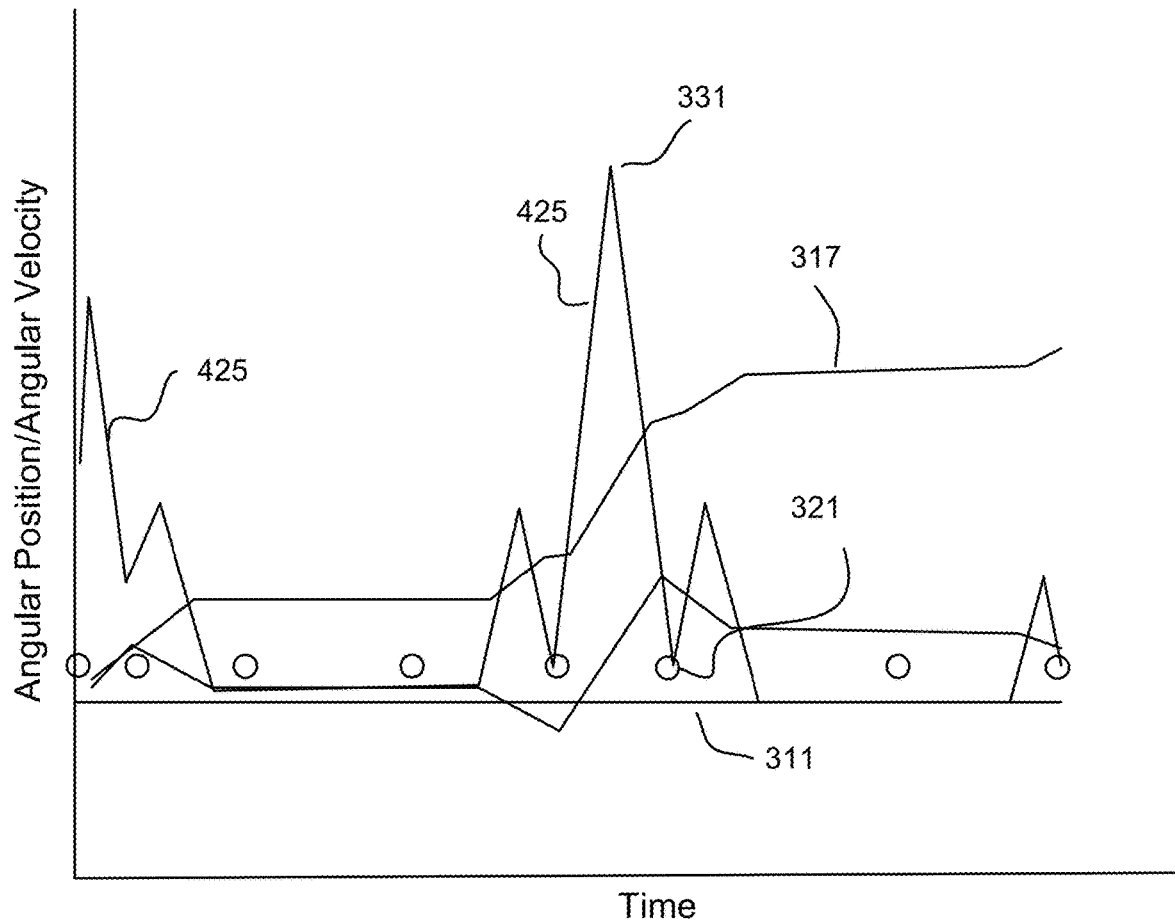
FIG. 3K is a graph illustrating a peak velocity according to an embodiment.

FIG. 3K is a graph illustrating a peak velocity 331 of the velocity profile 425. The velocity profile 425 may be calculated as a derivative of the cumulative angular position 317. In addition, the occurrence of voltage peaks 311 in time are shown. Direction changes 321 are determined based on the velocity profile 425. The direction changes 321 may be determined where the velocity of the motor 101 and/or velocity profile 425 reverses direction as shown hereafter in FIG. 3L. The peak velocity 331 is also determined for the velocity profile 425.

Figure 3L:
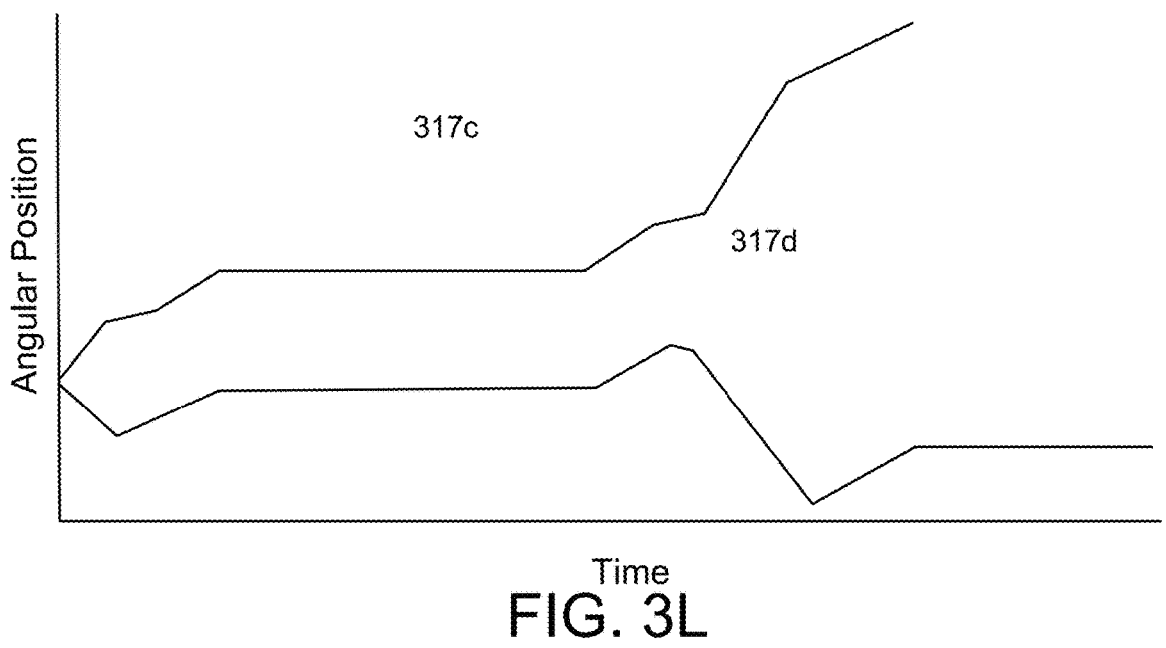
FIG. 3L is a graph illustrating cumulative angular position according to an embodiment.

FIG. 3L is a graph illustrating angular position. The cumulative angular position 317c of FIG. 3K is shown. In addition, the direction changes 321 are applied to the cumulative angular position 317c to yield a direction change cumulative angular position 317d.

Figure 3M:
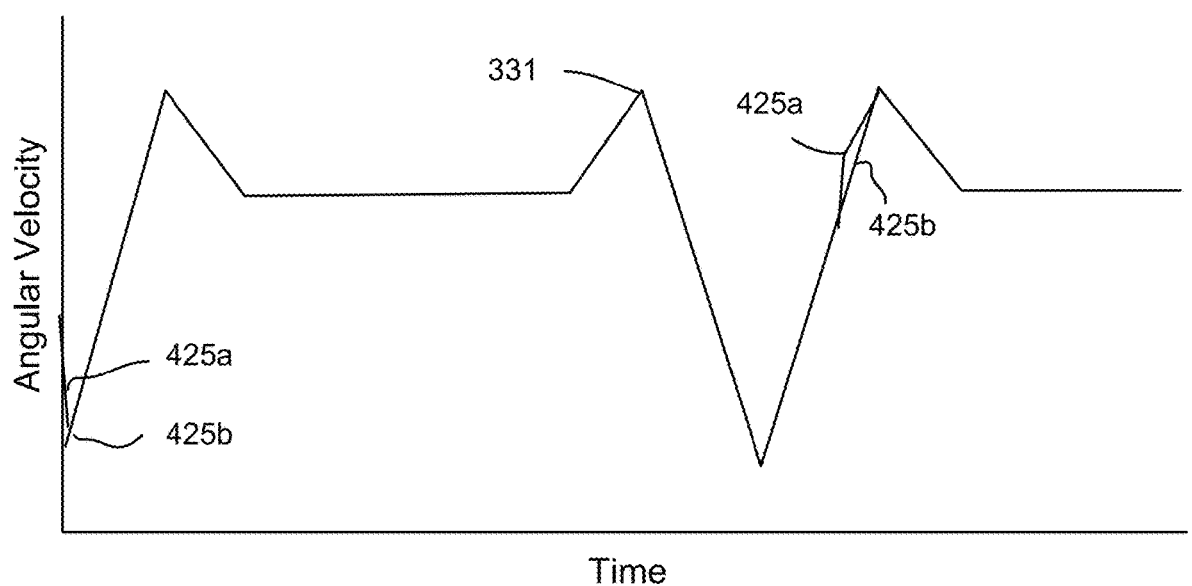
FIG. 3M is a graph illustrating an angular velocity profile according to an embodiment.

FIG. 3M is a graph illustrating one embodiment of the velocity profile 425a-b. The velocity profile 425a is shown before filtering by the programmable filter 203 and the velocity profile 425b is shown after filtering by the programmable filter 203. The filtered velocity profile 425b is much closer to an independently measured velocity. Thus, filtering the velocity profile 425 improves the accuracy of the velocity profile 425.

Figure 4A:
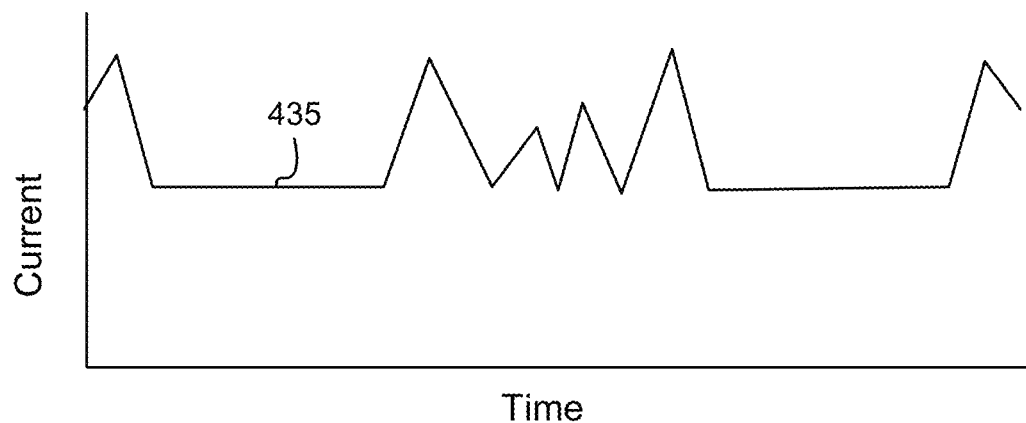
FIG. 4A is a graph illustrating current according to an embodiment.

FIG. 4A is a graph illustrating a vectoral sum squared 435 of a phase current 433. In one embodiment, the vectoral sum squared $I_s$ 435 is calculated using Equation 1, wherein $I_a$, $I_b$, $I_c$ are the phase currents 433 and/or phase currents 433 filtered by the programmable filter 203.

$$I_s = \sqrt{I_a^2 + I_b^2 + I_c^2} \qquad \text{Equation 1}$$

Figure 4B:
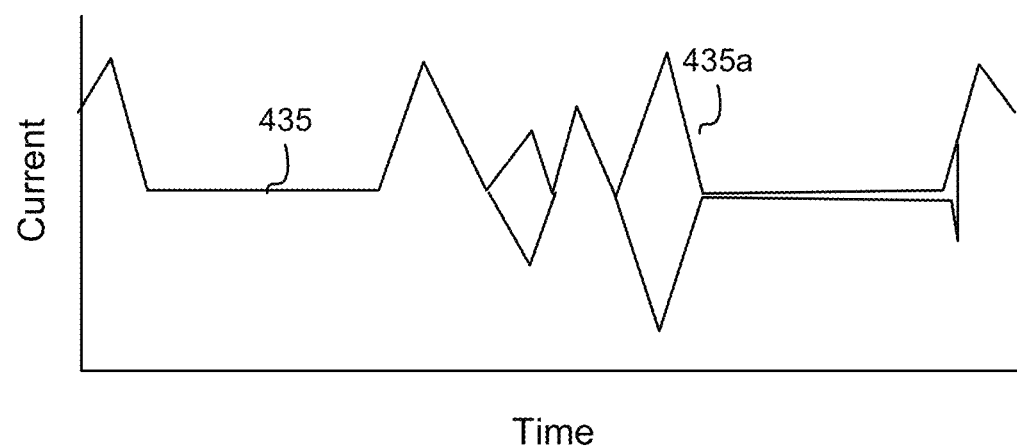
FIG. 4B is a graph illustrating unfolded current according to an embodiment.

FIG. 4B is a graph illustrating an unfolded vectoral sum squared 435 unfolded from the vectoral sum squared 435a of the phase current 433 of FIG. 4A to illustrate negative phase current 433.

Figure 4C:
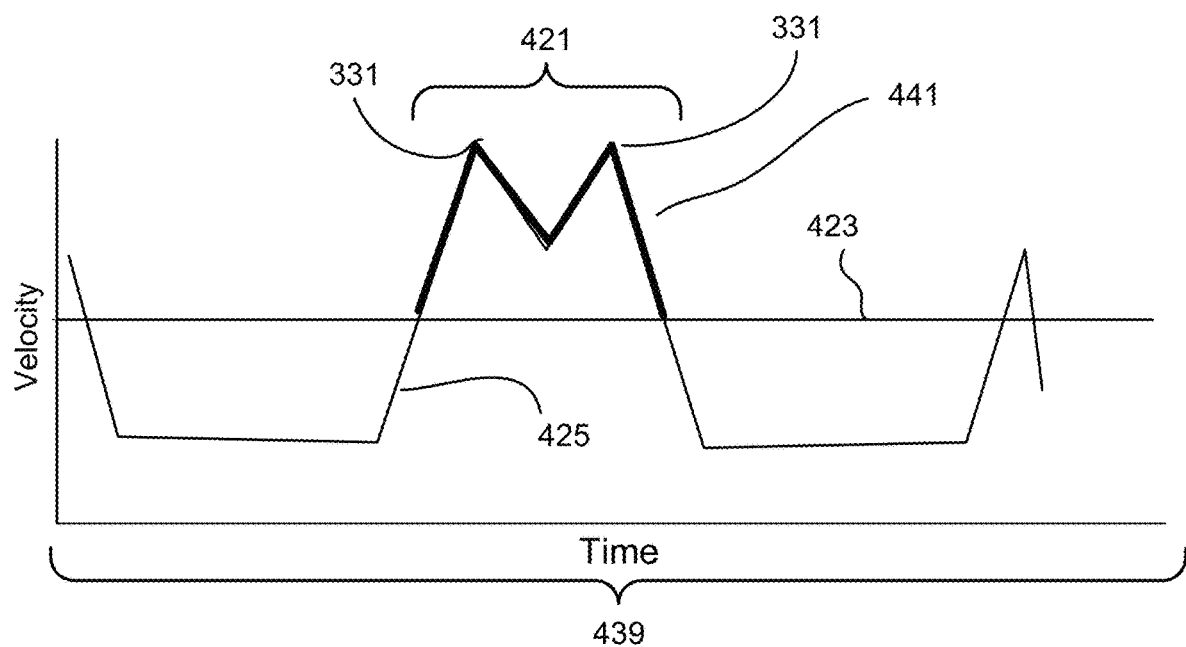
FIG. 4C is a graph of a time interval and velocity threshold according to an embodiment.

FIG. 4C is a graph of a time interval 421 and velocity threshold 423 for the velocity profile 425. A velocity profile 425 may be determined as shown in FIG. 3K. The velocity profile 425 includes at least one peak velocity 331 and is defined for an entire time interval 439. The entire time interval 439 may cover all measurements of the line-to-line voltages 301 and the phase currents 433. Alternatively, the entire time interval 439 may cover a portion of the measured line-to-line voltages 301 and the phase currents 433.

In addition, a velocity threshold 423 is shown. The velocity threshold 423 may be in the range of 10 to 30 percent of the peak velocity 331. In one embodiment, the velocity threshold 423 is 20 percent of a peak velocity 331. The velocity threshold 423 may identify times when the motor 101 is under load.

In the depicted embodiment, an interval velocity profile 441 is identified wherein the velocity profile 425 is greater than the velocity threshold 423. The interval velocity profile 441 covers the time interval 421 where the velocity profile 425 is greater than the velocity threshold 423. As a result, the interval velocity profile 441 is the times when the motor 101 is under load and/or unloaded. In one embodiment, the time interval 421 is a load time interval 421 wherein the motor 101 is under load. The determination of the time interval 421 and interval velocity profile 441 is used to determine a selected current signal 431 as will be described hereafter in FIG. 4D.

Figure 4D:
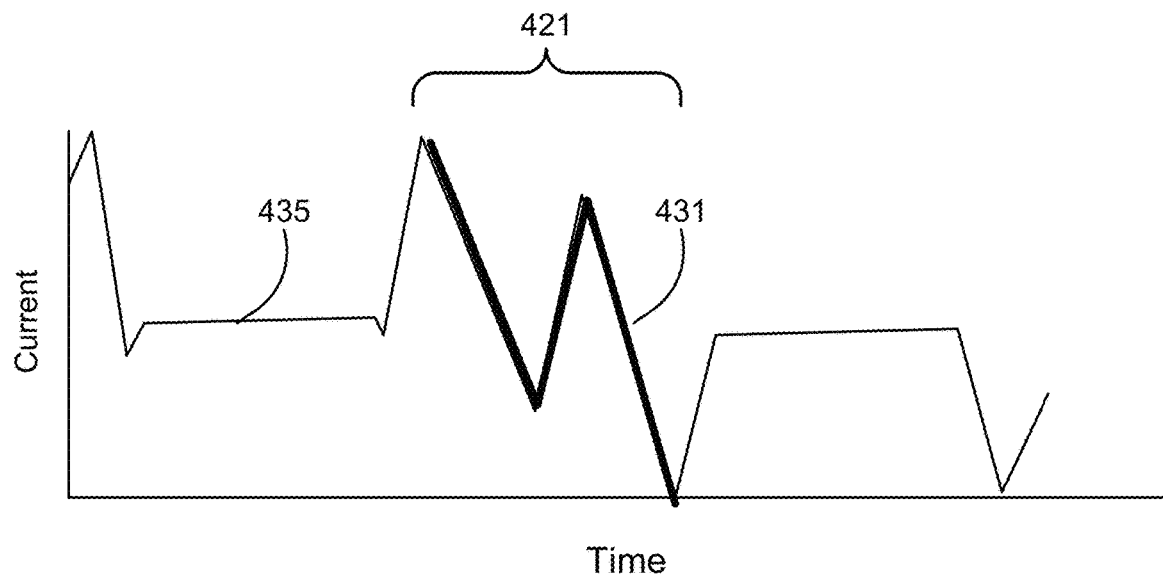
FIG. 4D is an unfolded phase current vectoral sum squared according to an embodiment.

FIG. 4D is the unfolded vectoral sum squared 435 of the phase currents. The selected current signal 431 is the vectoral sum squared 435 corresponding to the time interval 421.

Figure 4E:
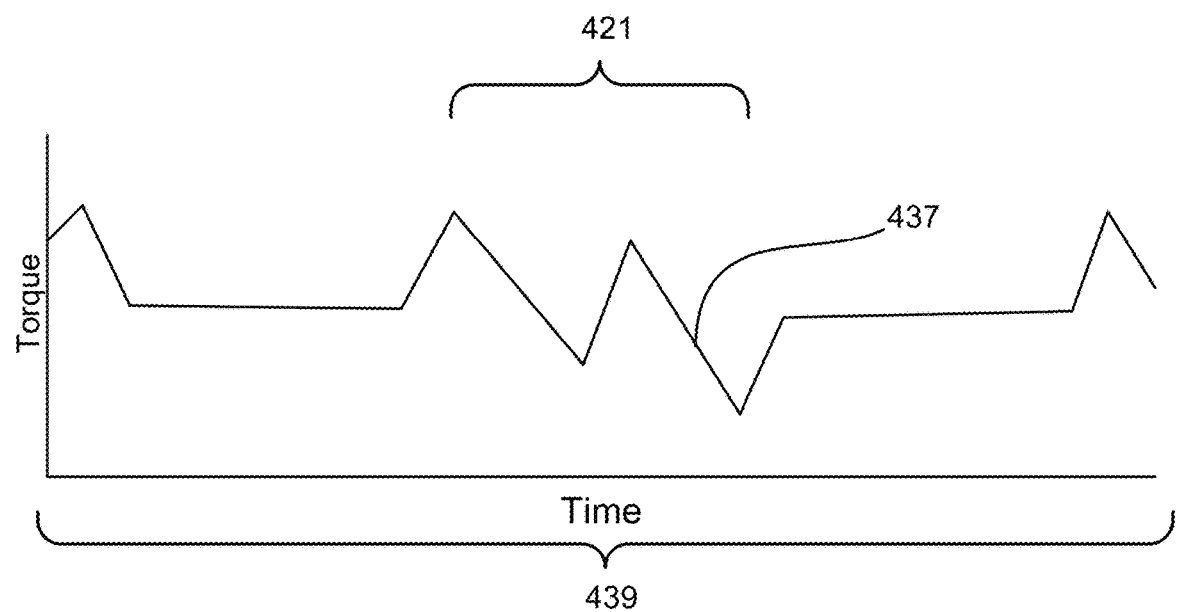
FIG. 4E is a graph illustrating a torque profile according to an embodiment.

FIG. 4E is a graph illustrating the torque profile 437. The torque profile 437 is the torque at the motor shaft or at the output of the gearbox 151. The torque profile 437 is shown for the time interval 421 and the entire time interval 439. The torque profile 437 may be estimated by scaling the vectoral sum squared 435 of the phase currents 433 to the developed torque profile 531 in FIG. 4F over the time interval 421 and/or interval velocity profile 441. The vectoral sum squared 435 may be scaled by a scaling factor. The remaining vectoral sum squared 435 may be scaled by the scaling factor to obtain the torque profile 437 for the entire time interval 439 of the velocity profile 425 as the torque profile 437.

Figure 4F:
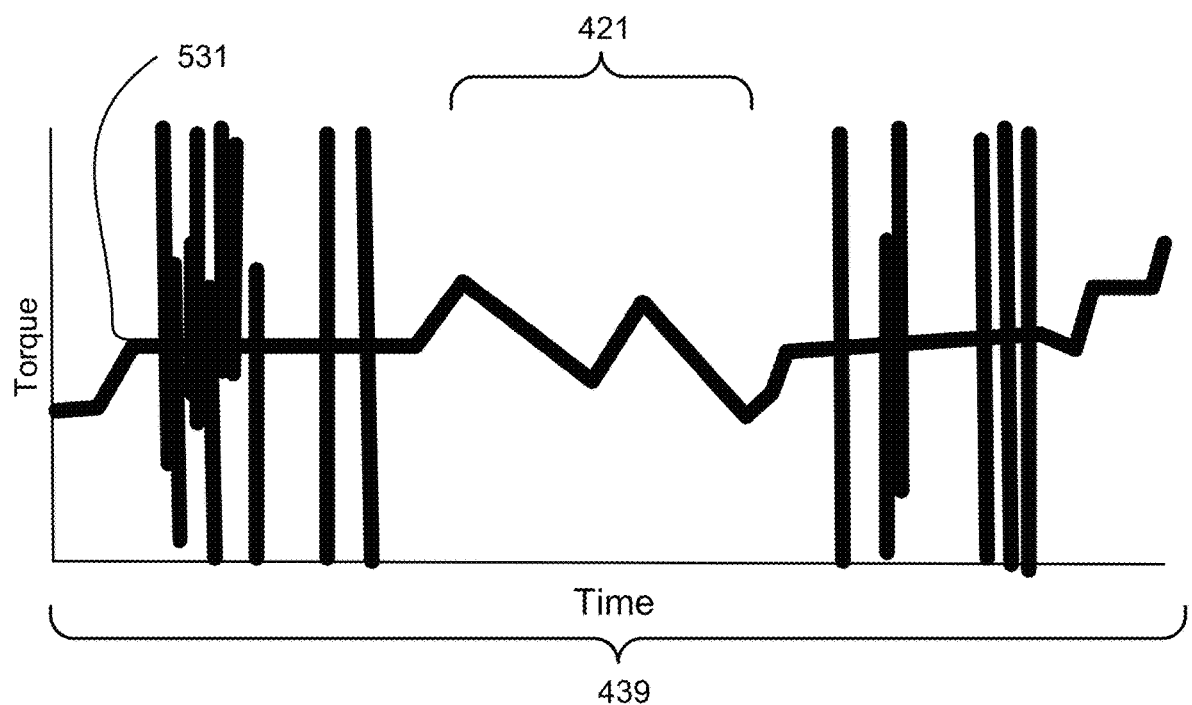
FIG. 4F is a graph of a developed torque profile according to an embodiment.

FIG. 4F is a graph of developed torque profile 531 that is calculated based on known torque equations. As shown, the developed torque profile 531 only provides usable torque estimation over the time interval 421 and noise and artifacts that render the developed torque profile 531 unusable over the entire time interval 439, but useable over the time interval 421. The vectoral sum squared 435 is scaled to the developed torque profile 531 over the time interval 421 to determine the scaling factor.

FIG. 5A is a schematic block diagram of a computer 400. The computer 400 may estimate the velocity profile 425 and the torque profile 437 for the motor 101. In the depicted embodiment, the computer 400 includes a processor 405, a memory 410, and communication hardware 415. The memory 410 may comprise a semiconductor storage device, a hard disk drive, and optical storage device, or combinations thereof. The memory 410 may store code. The processor 405 executes the code. The communication hardware 415 may communicate with other devices such as the portable sensor 181 and/or the controller 150.

Figure 5B:
FIG. 5B is a schematic block diagram of motor data according to an embodiment.

FIG. 5B is a schematic block diagram of motor data 520. The motor data 520 may record information, parameters, and calculated values relating to the motor 101 and the estimation of the velocity profile 425 and the torque profile 437. The motor data 520 maybe organized as a data structure in the memory 410. In the depicted embodiment, the motor data 520 includes a motor resistance 521, a rotor inertia 523, a gearbox inertia 525, an airgap torque profile 527, an acceleration torque profile 529, the developed torque profile 531, the low-pass-filter cutoff frequency 533, an ideal estimated current 535, the scaling factor 539, historical data 541, a system ideal model 543, a motor database 545, a motor type 547, and the torque profile 437.

The motor resistance 521 records a resistance for the motor 101. The motor resistance 521 may be measured and/or provided with the motor 101. The rotor inertia 523 records an inertia for the rotor 505. The rotor inertia 523 may be measured and/or provided with the motor 101. The gearbox inertia 525 records an inertia of the gearbox 151 of the motor 101. The gearbox inertia 525 may be measured and/or provided with the gearbox.

The airgap torque profile 527 is the torque developed inside the motor 101. Part of the airgap torque profile 527 is used to move the rotor 105 of the motor 101. The airgap torque profile 527 also includes some of the torque losses, including the stator losses which are accounted for by knowing the motor resistance 521. The airgap torque profile 527 may be determined from the line-to-line voltages 301, the phase currents 433, the motor resistance 521, and the interval velocity profile 441.

In one embodiment, the airgap torque profile $\tau_{ag}$ 527 is calculated using Equation 2, where $P_{in}$ is a sum of a product of input phase voltages 301 and phase currents 433 and $P_{ohm}$ is the motor resistance 521 multiplied by a sum of each phase current 433 squared. In one embodiment, the airgap torque profile 527 is filtered with the programmable filter 203.

$$\tau_{ag} = \frac{P_{in} - P_{ohm}}{\omega_m} \qquad \text{Equation 2}$$

The acceleration torque profile 529 may be calculated using Equation 3, where $J_R$ is the rotor inertia 523, $J_{GB}$ is the gearbox inertia 525, and $\dot{\omega}_M$ is angular acceleration of the motor 101. In one embodiment, $\dot{\omega}_M$ is filtered with the programmable filter 203.

$$\tau_{acc} = (J_R + J_{GB})\dot{\omega}_M \qquad \text{Equation 3}$$

The developed torque profile 531 may be calculated from the airgap torque profile 527 and the acceleration torque profile 529. The developed torque profile 531 may be the torque that the motor 101 needs to develop at a motor shaft if a gearbox 151 is not present on the system 100 or if the gearbox 151 is assumed to be part of the unknown mechanical system connected to the motor 101. In this case, only a new target motor 101 would be selected and the gearbox 151 would not be replaced.

Alternatively, the developed torque 531 may be the torque that the gearbox 151 needs to develop at the output of the gearbox 151 when the gearbox 151 is present on the system 100 and the gearbox 151 is not assumed to be part of the unknown mechanical system connected to the motor 101. In this case, a new target motor 101 and a new gearbox 151 (if verified to be necessary) would also be selected and replaced. Thus, the airgap torque 527 is the torque inside the motor 101.

In one embodiment, the developed torque profile $\tau_{dev}$ 531 is calculated using Equation 3.

$$\tau_{dev} = \tau_{ag} - \tau_{acc} \qquad \text{Equation 4}$$

The developed torque profile 531 represents the torque at a motor shaft after subtracting acceleration torque to drive the rotor inertia 523, and some motor torque losses or at the output of the gearbox 151 after subtracting acceleration torque to drive the rotor inertia 523 and gearbox inertia 525 and some motor torque losses. If only the motor 101 is replaced, the developed torque profile 531 is torque at the motor shaft of the motor 101. If motor 101 and gearbox 151 are replaced, developed torque profile 531 represents torque at the output of the gearbox 101. The developed torque profile 531 may be the sum of the airgap torque profile 527 and the acceleration torque profile 529.

The low-pass-filter cutoff frequency 553 records each low-pass-filter cutoff frequency 553 determined for each signal filtered by the programmable filter 203.

The historical data 541 records of velocity profile 425 and a torque profile 437 for a plurality of motors 101. In addition, the historical data 541 may record electrical anomalies, mechanical anomalies, system characteristics, and the like for each motor 101.

The system ideal model 543 may be generated based on the velocity profile 425 and the torque profile 437. In one embodiment, the system ideal model 543 is a digital simulation of the system 100 corresponding to the velocity profile 425 and the torque profile 437. The system ideal model 543 may also employ the historical data 541. The system ideal model 543 may be compared to the velocity profile 425 and/or the torque profile 437 of the motor 101 and/or system 100. The comparison between the system ideal model 543 and the motor 101 and/or motor 100 may identify electrical anomalies and/or mechanical anomalies within the motor 101 and/or system 100.

The ideal estimated current 535 may be calculated from the system ideal model 543 based on the historical data 541. The ideal estimated current 535 may be compared to the phase currents 433 to identify electrical anomalies and/or mechanical anomalies within the motor 101 and/or system 100.

The motor database 545 may record parameters for a plurality of target motors 101. In addition, the motor database 545 may record a velocity profile 425 and/or a torque profile 437 for each of the target motors 101. In one embodiment, the motor database 545 includes installation information for the target motors 101. The motor database 545 may be used to identify a target motor 101 to replace the current motor 101 based on the velocity profile 425 and the torque profile 437 of the current motor 101. The motor type 547 may specify that the motor 101 is one of a permanent magnet motor 101, an induction motor 101, and the like.

Figure 6A:
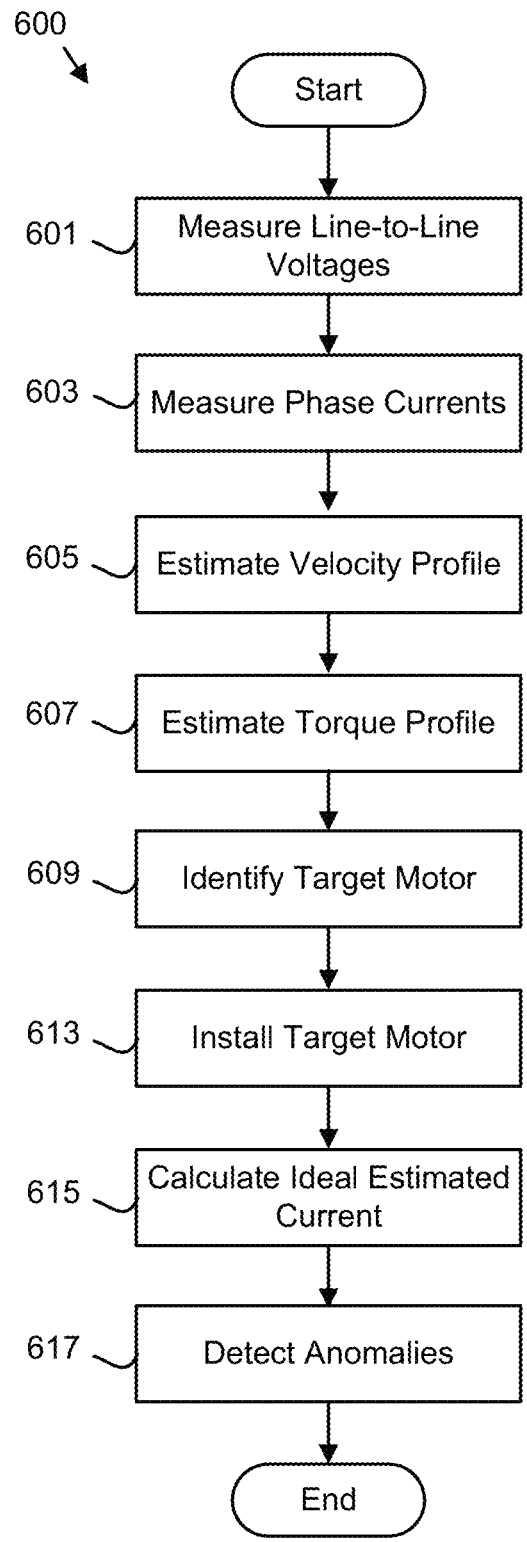
FIG. 6A is a flow chart diagram illustrating velocity and torque estimation according to an embodiment.

FIG. 6A is a flow chart diagram illustrating a velocity profile 425 and torque profile 437 estimation method 600. The method 600 estimates the velocity profile 425 and the torque profile 437. In addition, the method 600 may identify a target motor 101 and install the target motor 101. In one embodiment, the method 600 calculates the ideal estimated current 535. The method 600 may be performed by the computer 400 and/or processor 405 with the portable sensor 181 for the system 100.

The method 600 starts, and in one embodiment, the processor 405 measures 601 the line-to-line voltages 301. The line-to-line voltages 301 may be measured 601 using the portable sensor 181. In one embodiment, the line-to-line voltages 301 are measured 601 during normal operation of the system 100. In addition, the line-to-line voltages 301 may be measured 601 in the field. The line-to-line voltages 301 may be down sampled.

The processor 405 further measures 603 the phase currents 433. The phase currents 433 may be measured 603 with the portable sensor 181. In addition, the phase currents 433 may be measured 603 during normal operation of the system 100. The phase currents 433 may be measured 603 in the field. The processor 405 may measures 603 two of the three phase currents 433. Alternatively, the processor 405 may measures 603 each of the three phase currents 433. The phase currents 433 may be down sampled.

The processor 405 estimates 605 the velocity profile 425 based on the line-to-line voltages 301 and/or the phase currents 433 for the motor 101. The velocity profile 425 may be estimated 605 without a position input and/or a velocity input. As a result, the method 600 requires no position sensor and/or velocity sensor on the motor 101. Thus, the method 600 may be practiced without position sensors and/or velocity sensors. The estimation 605 of the velocity profile 425 is described in more detail in FIG. 6B.

The processor 405 further estimates 607 the torque profile 437 based on the line-to-line voltages 301, the phase currents 433, and the time interval 421 of the velocity profile 425 of motor velocities greater than the velocity threshold 423. The motor 101 may be operating over the time interval 421. The estimation 607 of the torque profile 437 is described in more detail in FIG. 6C.

The processor 405 may identify 609 the target motor 101 that provides the velocity profile 425 and/or the torque profile 437. In one embodiment, the target motor 101 is identified 609 from the motor database 545 as having a velocity profile 425 and/or torque profile 437 that meet and/or exceed the velocity profile 425 and/or torque profile 437 of the current motor 101.

The processor 405 may direct the installation 613 of the target motor 101 in the system 100. In one embodiment, the processor 405 provides installation information from the motor database 545.

In one embodiment, the processor 405 calculates 615 the ideal estimated current 535 for the motor 101. The ideal estimated current 535 may be calculated 615 based on the system ideal model 543. In one embodiment, the system ideal model 543 is a digital twin of the system 100. The system ideal model 543 may be generated based on the velocity a profiles 425 and torque profiles 437 of a plurality of motors 101 and/or systems 100 and corresponding motor data 520.

In one embodiment, the processor 405 identifies one or more similar motors 101 from the motor database 545 with parameters similar to the motor data 520. The processor 405 may further generate the system ideal model 543 based on the velocity profile 425 and torque profile 437 of the one or more similar motors 101.

The processor 405 may calculate 615 the ideal estimated current 535 for the motor 101 based on the system ideal model 543. In one embodiment, the processor 405 compares the ideal estimated current 535 to the phase currents 433. In addition, the processor 405 may detect 617 mechanical anomalies and/or electrical anomalies in the motor 101 based on the comparison of the ideal estimated current 535 and the phase currents 433 and the method 600 ends.

Figure 6B:
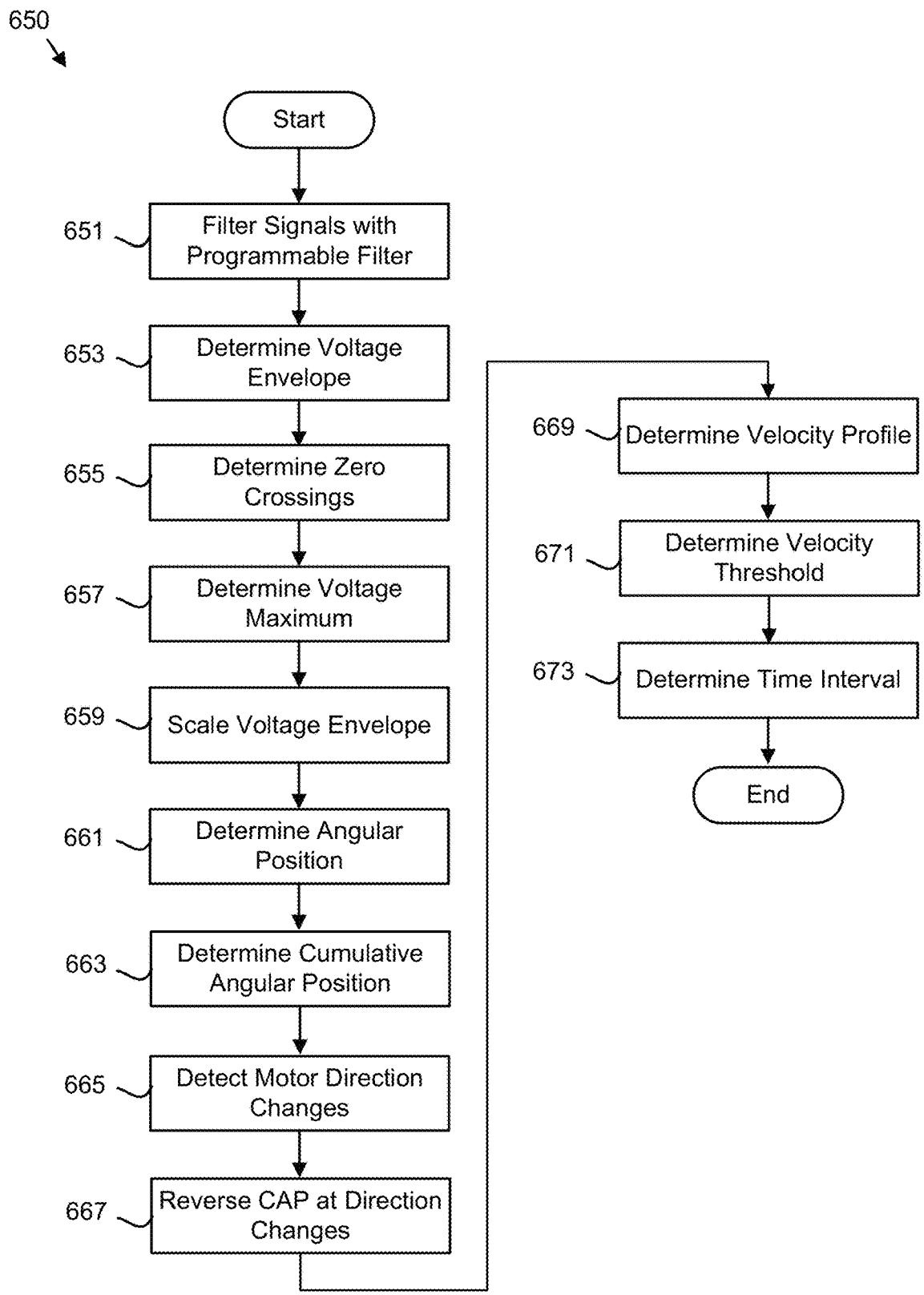
FIG. 6B is a flow chart diagram of determining a velocity profile and time interval according to an embodiment.

FIG. 6B is a flow chart diagram of a velocity profile 425 and time interval 421 determination method 650. The method 650 determines the velocity profile 425 and the time interval 421. The method 650 may be performed by the computer 400 and/or processor 405 with the portable sensor 181 for the system 100.

The method 650 starts, and in one embodiment, the processor 405 filters 651 signals including the line-to-line voltages 301 and/or phase currents 433. The signals including the line-to-line voltages 301 may be digitized. The signals may be filtered 651 with a programmable filter 203. The filtering 651 with a programmable filter 203 is described in more detail in FIG. 6D.

The processor 405 may further determine 653 the voltage envelope 303 for the line-to-line voltages 301. The voltage envelope 303 may be determined 653 as peaks of the line-to-line voltage including both positive and negative peaks as shown in FIG. 3A. in a certain embodiment, the negative peaks of the line-to-line voltage 303 are reflected around the zero voltage and included with a positive peaks to generate the voltage envelope 303 as shown in FIG. 3B.

The processor 405 may determine 655 the zero crossings 305 for the line-to-line voltages 301. The zero crossings 305 may be at a time wherein signal magnitudes of the line-to-line voltages 301 are zero as shown in FIG. 3C.

The processor 405 may further determine 657 of voltage maximum 309 for the line-to-line voltages 301. The voltage maximum 309 may be a voltage envelope 303 with a maximum signal magnitude as shown in FIG. 3C.

The processor 405 may scale 659 each voltage envelope 303 and/or line-to-line voltage 301 to the voltage maximum 309 as a scaled voltage signal 307. In one embodiment, each voltage peak 311 is set equal to the voltage maximum 309 as shown in FIG. 3D.

The processor 405 may determine 661 the angular position 313 from the scaled voltage signal 307. In one embodiment, an angular position 313 of the rotor 105 of a positive voltage peak 311$a$ is at determine 661 to be at an angular position 313 of $\pi/2$ and a negative voltage peak 311$b$ is determined 661 to be at an angular position 313 of $-\pi/2$ as illustrated in FIG. 3E. In addition, angular positions 313 are determined 661 at each time as shown in FIG. 3F.

The processor 405 may determine 663 the cumulative angular position 317 from the scaled voltage signal 307. The processor 405 may transform the angular positions 313 into single direction angular positions 315 by reversing negative angular positions 313 as shown in FIG. 3F. In addition, a first angular position of each single direction angular position 315 may be set equal to a last angular position of a proceeding single direction angular position 315 or the last angular position of the proceeding single direction angular position 315 plus an offset to yield the cumulative angular positions 317 as shown in FIG. 3F.

In one embodiment, the processor 405 detect 665 motor direction changes 321. The direction changes 321 may be detected 665 where the velocity of the motor 101 changes direction and/or sign as shown in FIG. 3K. The processor 405 may reverse 667 the cumulative angular position 317 at the direction changes 321. As a result, the continuously increasing cumulative angular position 317c becomes a bidirectional cumulative angular position 317d as shown in FIG. 3L. In addition, the processor 405 may filter the cumulative angular position 317 with the programmable filter 203.

The processor 405 determines 669 the velocity profile 425 from the cumulative angular position 317. In one embodiment, the processor 405 calculates the velocity profile 425 as a derivative of the bidirectional cumulative angular position 317d.

In one embodiment, the processor 405 determines 671 the velocity threshold 423. The velocity threshold 423 may be in the range of 10 to 30 percent of a peak velocity 331 of the velocity profile 425 as shown in FIG. 4C. In a certain embodiment, the velocity threshold 423 is 20 percent of a peak velocity 331.

The processor 405 may determine 673 the time interval 421 and the method 650 ends. The time interval 421 may be determined 673 as contiguous times when the velocity profile 425 of motor velocities is greater than the velocity threshold 423. In one embodiment, the motor 101 is operating over the time interval 421.

Figure 6C:
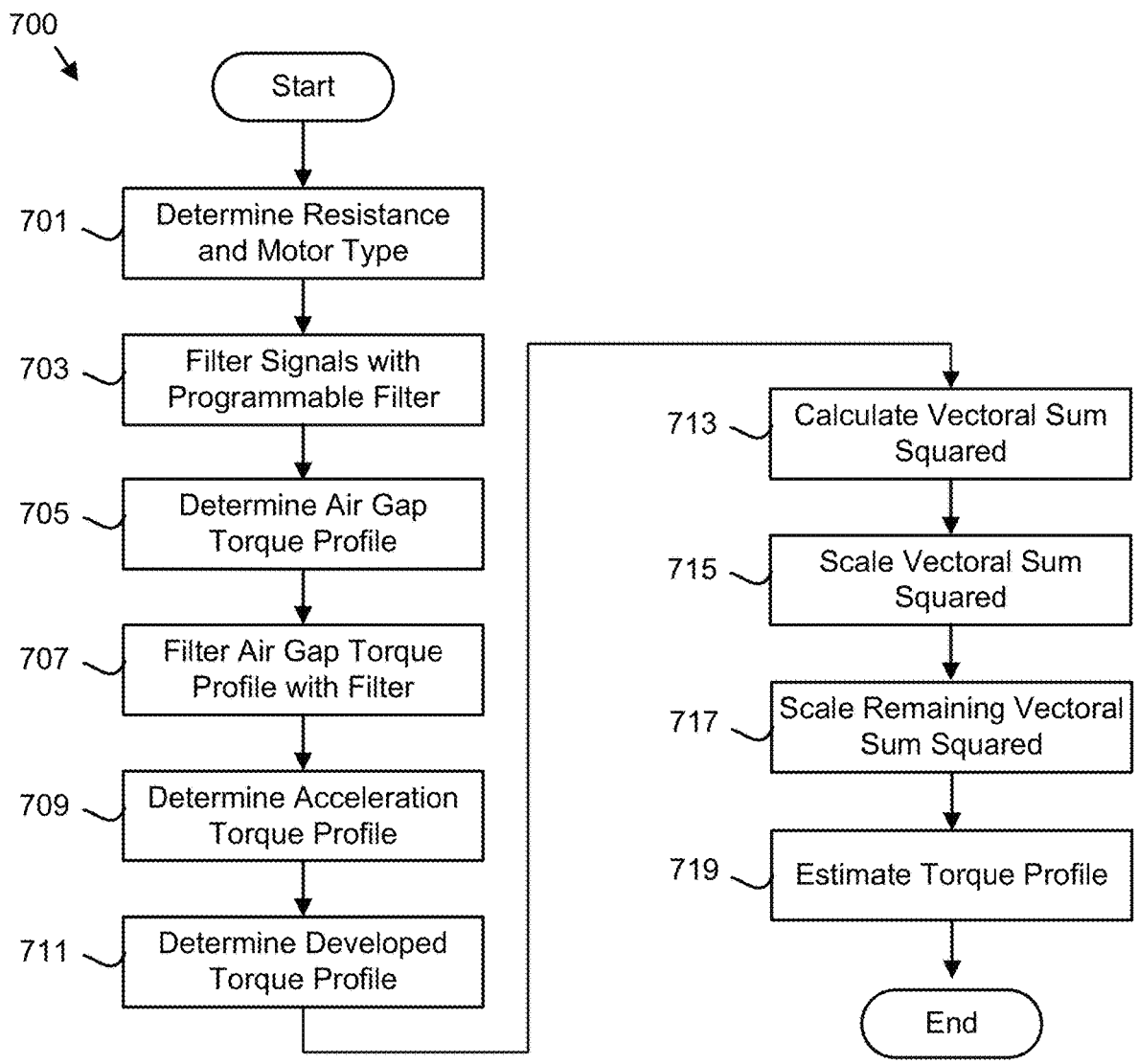
FIG. 6C is a flow chart diagram illustrating torque profile estimation according to an embodiment.

FIG. 6C is a flow chart diagram illustrating a torque profile 437 estimation method 700. The method 700 estimates the torque profile 437. The method 700 may be performed by the computer 400 and/or processor 405 with the portable sensor 181 and 183 for the system 100.

The method 700 starts, and in one embodiment, the processor 405 determines 701 the motor resistance 521, the rotor inertia 523, the gearbox inertia 525, and/or the motor type 547. The processor 405 may consult the motor data 520. In addition, the motor resistance 521, rotor inertia 523, and/or gearbox inertia 525 may be measured.

The processor 405 may filter 703 the phase currents 433 with the programmable filter 203. Filtering 703 with the programmable filter 203 is described in more detail in FIG. 6D.

The processor 405 may determine 705 the airgap torque profile 527. The airgap torque profile 527 may be determined 507 from the from the line-to-line voltages 301, the phase currents 433, the motor resistance 521, and/or the interval velocity profile 441. In one embodiment, the airgap torque profile 527 is calculated using Equation 2.

Figure 6D:
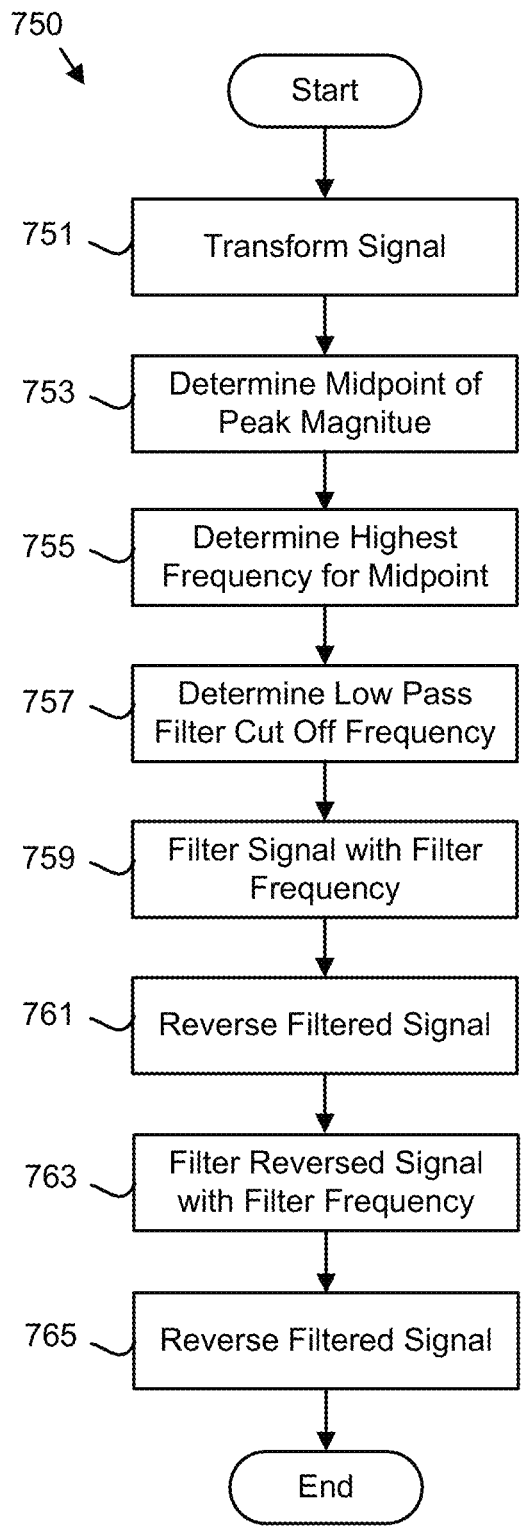
FIG. 6D is a flow chart diagram illustrating signal filtering according to an embodiment.

In one embodiment, the processor 405 filters 707 the airgap torque profile 527 with the programmable filter 203. FIG. 6D describes the filtering 707 of the signal of the airgap torque profile 527 in more detail.

The processor 405 may determine 709 the acceleration torque profile 529 from the velocity profile 425, the rotor inertia 523, and/or gearbox inertia 525. In one embodiment, the acceleration torque profile 529 is calculated using Equation 3.

The processor 405 may further determine 711 the developed torque profile 531 from the airgap torque 527 and the acceleration torque profile 529. The developed torque profile 531 may be the result of the airgap torque profile 527 minus the acceleration torque profile 529 as shown in Equation 4.

The processor 405 may calculate 713 the vectoral sum squared 435. The vectoral sum squared 435 may be calculated using Equation 1. In addition, the processor 405 may scale 715 the vectoral sum squared 435 by the scaling factor 539 to the developed torque profile 531 over the time interval 421 to obtain the current signal 431 for the time interval 421. In one embodiment, the scaling factor 539 is calculated so that the vectoral sum squared 435 multiplied by the scaling factor 539 is equivalent to the developed torque profile 531. The vectoral sum squared 435 may be only scaled by the scaling factor 539 over the time interval 421 to yield the current signal 431 as shown in FIGS. 4D and 4F. The use of the scaling factor 539 improves the computational efficiency of the computer 400 and the accuracy of determining the vectoral sum squared 435.

The processor 405 may further scale 717 the remaining vectoral sum squared 435 that is not within the time interval 421 by the scaling factor 539 to estimate 719 the torque profile 437 for the entire time interval 439 of the velocity profile 425 and the method ends. The use of the scaling factor 539 improves the computational efficiency of the computer 400 and the accuracy of the torque profile 437. In one embodiment, the line-to-line voltages 301, the phase currents 433, the velocity profile 425, and the torque profile 437 are synchronized in time.

FIG. 6D is a flowchart diagram illustrating a signal filtering method 750. The method 750 may filter a signal. The signal may be an input time-domain signal 231 such as the line-to-line voltages 301, the phase currents 433, the airgap torque profile 527, and the like. The method 750 may be performed by the computer 400 and/or processor 405 with the portable sensor 181 for the system 100.

The method 750 starts, and in one embodiment, the processor 405 transforms 751 the input time-domain signal 231 to a frequency-domain signal input signal 229. The input time-domain signal 231 may be transformed with a fast Fourier transform and/or a discrete Fourier transform.

The processor 405 further determines 753 the magnitude midpoint 223 of the peak magnitude 221 of the frequency-domain input signal 229 as shown in FIG. 2A. The processor 405 may identify the peak magnitude 221. The processor 405 may determine 753 the magnitude midpoint 223 to be in the range of 40 to 60 percent of the peak magnitude 221. In a certain embodiment, the magnitude midpoint 223 is 50 percent of the peak magnitude 221.

The processor 405 determines 755 the highest frequency 227 of the frequency-domain input signal 229 that exceeds the magnitude midpoint 223 as shown in FIG. 2A. The processor 405 determines 757 the low-pass-filter cutoff frequency 533 based on the highest frequency 227 exceeding the magnitude midpoint 223. The low-pass-filter cutoff frequency 533 may be determined 755 to be in the range of 5 to 15 percent of the highest midpoint frequency 227. In a certain embodiment, the low-pass-filter cutoff frequency 533 is 10 percent of the highest midpoint frequency 227.

The processor 405 filters 759 the input time-domain signal 231 with the programmable filter 203 employing the low-pass-filter cutoff frequency 533 to yield a first filtered signal 233 as shown in FIG. 2C. The processor 405 further reverses 761 the first filtered signal 233 to yield the reverse signal 235 as shown in FIG. 2D. The processor 405 filters 763 the reverse signal 235 with the programmable filter 203 employing the low-pass-filter cutoff frequency 533 to yield a second filtered signal 237 as shown in FIG. 2D. In addition, the processor 405 reverses the second filtered signal 237 to yield an output signal 239 and the method 750 ends.

Problem/Solution

It is often desirable to replace motors 101 in motor systems 100. For example, it may be desirable to employ a more efficient motor 101, a quieter motor, and the like. In addition, replacing a motor 101 with a target motor 101 may extend the life of a machine that employs the motor 101 and/or motor system 100. Unfortunately, it is difficult to properly size and/or select the target motor 101 for the motor system 100. Accurate torque and/or velocity documentation may be unavailable, or documentation of the mechanical system driven by the motor and speed profiles that the motor is performing may also be unavailable to mathematically estimate the required torque and speed signals to select a target motor. The motor system 100 may also lack the sensors needed to determine a position input and/or velocity input. As a result, the velocity profile 425 and/or the torque profile 437 for the motor 101 are often inaccurately estimated. As a result, the selection of a target motor based on inaccurate torque and speed profiles may be inappropriate. For example, the target motor may be too large which results in a low energy efficient solution, too small such that there is not enough torque or speed to drive the mechanical system to perform the task associated to the motor in a machine, and the like.

The embodiments accurately estimate the velocity profile 425 for the motor 101 based on the line-to-line voltages 301 and phase currents 433 for the motor 101, and without a position input and a velocity input. In addition, the embodiments estimate the torque profile 437 for the motor 101 based on the line-to-line voltages 301, the phase currents 433, and the time interval 421 of the velocity profile 425 of motor velocities greater than the velocity threshold 423. As a result, noise and spurious signals are filtered out, yielding an accurate and reliable torque profile 437 that may be used to accurately size the motor 101 and/or target motor 101. The embodiments greatly increase the reliability and accuracy of velocity profile 425 and torque profile 437 calculations. Thus the motor 101 maybe reliably replaced with the target motor 101, improving the efficiency of the motor system 100.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method comprising:
    estimating, by use of a processor, a velocity profile for a motor based on line-to-line voltages and phase currents for the motor, wherein the velocity profile is estimated without a position input and a velocity input;
    estimating a torque profile for the motor based on the line-to-line voltages, the phase currents, and a time interval of the velocity profile of motor velocities greater than a velocity threshold, and wherein the motor is operating over the time interval and the velocity threshold is in the range of 10 to 30 percent of a peak velocity; and
    controlling the motor using the torque profile to estimate the torque of the motor.

2. The method of claim 1, wherein the torque profile is further estimated by:
    scaling a vectoral sum squared of the phase currents by a scaling factor to a developed torque profile over the time interval to obtain an interval torque profile for the time interval; and
    scaling the remaining profile of vectoral sum squared not in the time interval by the scaling factor to obtain the torque profile for an entire time interval of the velocity profile, and wherein the line-to-line voltages, the phase currents, the velocity profile and the torque profile are synchronized.

3. The method of claim 2, wherein the developed torque profile is estimated by:
    determining an airgap torque profile from the line-to-line voltages, the phase currents, a motor resistance, and the interval velocity profile;
    determining an acceleration torque profile from the velocity profile a rotor load, and/or a gearbox load; and
    determining the developed torque profile from the airgap torque and the acceleration torque profile.

4. The method of claim 3, wherein the airgap torque profile is filtered with a programmable filter.

5. The method of claim 1, the method further comprising identifying a target motor that provides the velocity profile and the torque profile.

6. The method of claim 5, the method further comprising replacing the motor with the target motor.

7. The method of claim 1, wherein the velocity profile is further estimated by:
    determining the cumulative angular position from a scaled voltage signal; and
    reversing the cumulative angular position direction at motor direction changes; and
    determining the velocity profile from the cumulative angular position.

8. The method of claim 7, the method further comprising:
    determining a voltage envelope for the line-to-line voltages;
    determining zero crossings for the line-to-line voltages;
    determining a voltage maximum for the line-to-line voltages; and
    scaling each line-to-line voltage to the voltage maximum as the scaled voltage signal.

9. The method of claim 8, wherein the voltage envelope comprises merged voltage peaks for positive and negative voltages for increased accuracy, the cumulative angular position is determined from single direction angular positions, and the cumulative angular position is filtered with a programmable filter.

10. The method of claim 9, wherein the programmable filter filters by:
    transforming an input time-domain signal to a frequency-domain input signal;
    determining a magnitude midpoint of a peak magnitude of the frequency-domain input signal;
    determining a highest frequency exceeding the magnitude midpoint;
    determining a low-pass-filter cutoff frequency based on the highest frequency exceeding the magnitude midpoint;

filtering the input time-domain signal with the programmable filter employing the low-pass-filter cutoff frequency to yield a first filtered signal;
reversing the first filtered signal;
filtering the reversed signal with the programmable filter employing the low-pass-filter cutoff frequency to yield a second filtered signal; and
reversing the second filtered signal to yield an output signal.

11. The method of claim 1, wherein the line-to-line voltages and the phase currents are measured with a portable sensor.

12. The method of claim 1, the method further comprising calculating an ideal estimated current from a system ideal model based on historical data.

13. An apparatus comprising:
a processor;
a memory storing code executable by the processor to perform:
estimating a velocity profile for a motor based on line-to-line voltages and phase currents for the motor, wherein the velocity profile is estimated without a position input and a velocity input;
estimating a torque profile for the motor based on the line-to-line voltages, the phase currents, and a time interval of the velocity profile of motor velocities greater than a velocity threshold, and wherein the motor is operating over the time interval and the velocity threshold is in the range of 10 to 30 percent of a peak velocity; and
controlling the motor using the torque profile to estimate the torque of the motor.

14. The apparatus of claim 13, wherein the torque profile is estimated by:
scaling a vectoral sum squared of the phase currents by a scaling factor to a developed torque profile over the time interval to obtain an interval torque profile for the time interval; and
scaling the remaining profile of vectoral sum squared not in the time interval by the scaling factor to obtain the torque profile for an entire time interval of the velocity profile, and wherein the line-to-line voltages, the phase currents, the velocity profile and the torque profile are synchronized.

15. The apparatus of claim 14, wherein the developed torque profile is estimated by:
determining an airgap torque profile from the line-to-line voltages, the phase currents, a motor resistance, and the interval velocity profile;
determining an acceleration torque profile from the velocity profile a rotor load, and/or a gearbox load; and
determining the developed torque profile from the airgap torque and the acceleration torque profile.

16. A computer program product, the computer program product comprising a non-transitory computer readable storage medium having program code embodied therein, the program code readable/executable by a processor to:
estimate a velocity profile for a motor based on line-to-line voltages and phase currents for the motor, wherein the velocity profile is estimated without a position input and a velocity input by:
determining a cumulative angular position from a scaled voltage signal;
reversing the cumulative angular position direction at motor direction changes,
determining the velocity profile from the cumulative angular position; and
estimate a torque profile for the motor based on the line-to-line voltages, the phase currents, and a time interval of the velocity profile of motor velocities greater than a velocity threshold, and wherein the motor is operating over the time interval; and
control the motor using the torque profile to estimate the torque of the motor.

17. The computer program product of claim 16, wherein the torque profile is further estimated by:
scaling a vectoral sum squared of the phase currents by a scaling factor to a developed torque profile over the time interval to obtain an interval torque profile for the time interval; and
scaling the remaining profile of vectoral sum squared not in the time interval by the scaling factor to obtain the torque profile for an entire time interval of the velocity profile, and wherein the line-to-line voltages, the phase currents, the velocity profile and the torque profile are synchronized.

18. The computer program product of claim 16, wherein the developed torque profile is estimated by:
determining an airgap torque profile from the line-to-line voltages, the phase currents, a motor resistance, and the interval velocity profile;
determining an acceleration torque profile from the velocity profile a rotor load, and/or a gearbox load; and
determining the developed torque profile from the airgap torque and the acceleration torque profile.

* * * * *